(12) United States Patent
Yamazaki

(10) Patent No.: US 9,406,786 B2
(45) Date of Patent: Aug. 2, 2016

(54) METHOD FOR MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/742,897

(22) Filed: Jun. 18, 2015

(65) Prior Publication Data

US 2015/0287814 A1 Oct. 8, 2015

Related U.S. Application Data

(60) Continuation of application No. 14/024,721, filed on Sep. 12, 2013, now Pat. No. 9,064,898, which is a division of application No. 13/071,818, filed on Mar. 25, 2011, now Pat. No. 8,551,810.

(30) Foreign Application Priority Data

Mar. 26, 2010 (JP) ................. 2010-072532

(51) Int. Cl.
*H01L 29/66* (2006.01)
*H01L 29/786* (2006.01)
(Continued)

(52) U.S. Cl.
CPC .... *H01L 29/66969* (2013.01); *H01L 21/47635* (2013.01); *H01L 29/66742* (2013.01); *H01L 29/7869* (2013.01); *H01L 29/78606* (2013.01);
(Continued)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 001763930 A 4/2006
EP 1737044 A 12/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Yasser A Abdelaziez
(74) *Attorney, Agent, or Firm* — Fish & Richardson P.C.

(57) ABSTRACT

In a transistor including an oxide semiconductor film, a metal oxide film for preventing electrification which is in contact with the oxide semiconductor film and covers a source electrode and a drain electrode is formed. Then, oxygen is introduced (added) to the oxide semiconductor film through the metal oxide film and heat treatment is performed. Through these steps of oxygen introduction and heat treatment, impurities such as hydrogen, a hydroxyl group, or hydride are intentionally removed from the oxide semiconductor film, so that the oxide semiconductor film is highly purified. Further, by providing the metal oxide film, generation of a parasitic channel on a back channel side of the oxide semiconductor film can be prevented in the transistor.

17 Claims, 9 Drawing Sheets

(51) Int. Cl.
*H01L 21/4763* (2006.01)
*H01L 27/12* (2006.01)
(52) U.S. Cl.
CPC ....... *H01L 29/78696* (2013.01); *H01L 27/1225* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,060,594 B2 | 6/2006 | Wang |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,093,589 B2 | 1/2012 | Sugihara et al. |
| 8,129,717 B2 | 3/2012 | Yamazaki et al. |
| 8,129,719 B2 | 3/2012 | Yamazaki et al. |
| 8,143,115 B2 | 3/2012 | Omura et al. |
| 8,148,721 B2 | 4/2012 | Hayashi et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,247,276 B2 | 8/2012 | Kondo et al. |
| 8,274,078 B2 | 9/2012 | Itagaki et al. |
| 8,343,817 B2 | 1/2013 | Miyairi et al. |
| 8,445,902 B2 | 5/2013 | Sato et al. |
| 8,502,217 B2 | 8/2013 | Sato et al. |
| 8,502,221 B2 | 8/2013 | Yamazaki |
| 8,551,810 B2 | 10/2013 | Yamazaki |
| 8,563,977 B2 | 10/2013 | Shimada et al. |
| 8,729,544 B2 | 5/2014 | Yamazaki et al. |
| 8,729,547 B2 | 5/2014 | Miyairi et al. |
| 9,064,898 B2 | 6/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 | 3/2003 | Kawasaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0192248 A1 | 8/2006 | Wang |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0044714 A1 | 3/2007 | White |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308806 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0236655 A1 | 9/2009 | Choi et al. |
| 2009/0278120 A1 | 11/2009 | Lee et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2009/0321732 A1 | 12/2009 | Kim et al. |
| 2010/0006833 A1 | 1/2010 | Ha et al. |
| 2010/0032668 A1 | 2/2010 | Yamazaki et al. |
| 2010/0038641 A1 | 2/2010 | Imai |
| 2010/0051937 A1 | 3/2010 | Kaji et al. |
| 2010/0051949 A1 | 3/2010 | Yamazaki et al. |
| 2010/0059746 A1 | 3/2010 | Itai |
| 2010/0065837 A1 | 3/2010 | Omura et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163863 A1 | 7/2010 | Yaegashi |
| 2010/0200843 A1 | 8/2010 | Arai et al. |
| 2010/0264412 A1 | 10/2010 | Yamazaki et al. |
| 2010/0295041 A1 | 11/2010 | Kumomi et al. |
| 2010/0320458 A1 | 12/2010 | Umeda et al. |
| 2010/0320459 A1 | 12/2010 | Umeda et al. |
| 2011/0065216 A1 | 3/2011 | Kaji et al. |
| 2011/0095288 A1 | 4/2011 | Morosawa et al. |
| 2011/0136302 A1* | 6/2011 | Yamazaki ......... H01L 21/28176 438/156 |

(56) References Cited

U.S. PATENT DOCUMENTS

| | | |
|---|---|---|
| 2011/0175090 A1 | 7/2011 | Sugihara et al. |
| 2011/0193083 A1 | 8/2011 | Kim et al. |
| 2011/0215328 A1 | 9/2011 | Morosawa et al. |
| 2011/0240990 A1 | 10/2011 | Yamazaki |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0248260 A1 | 10/2011 | Yamazaki |
| 2012/0108006 A1 | 5/2012 | Yamazaki et al. |
| 2012/0108007 A1 | 5/2012 | Yamazaki et al. |
| 2012/0119205 A1 | 5/2012 | Taniguchi et al. |
| 2012/0132908 A1 | 5/2012 | Sugihara et al. |
| 2012/0132911 A1 | 5/2012 | Shimada et al. |
| 2012/0168750 A1 | 7/2012 | Hayashi et al. |
| 2012/0286278 A1 | 11/2012 | Kondo et al. |
| 2015/0084048 A1 | 3/2015 | Hayashi et al. |
| 2015/0287814 A1 | 10/2015 | Yamazaki |

FOREIGN PATENT DOCUMENTS

| | | |
|---|---|---|
| EP | 2068367 A | 6/2009 |
| EP | 2159845 A | 3/2010 |
| EP | 2195849 A | 6/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2006-165528 A | 6/2006 |
| JP | 2007-150158 A | 6/2007 |
| JP | 2008-060419 A | 3/2008 |
| JP | 2008-218495 A | 9/2008 |
| JP | 2009-231613 A | 10/2009 |
| JP | 2009-277701 A | 11/2009 |
| JP | 2010-016163 A | 1/2010 |
| JP | 2010-016347 A | 1/2010 |
| JP | 2010-045263 A | 2/2010 |
| JP | 2010-056539 A | 3/2010 |
| JP | 2010-067954 A | 3/2010 |
| JP | 2013-016862 A | 1/2013 |
| KR | 2009-0057690 A | 6/2009 |
| KR | 2010-0014164 A | 2/2010 |
| KR | 2010-0019381 A | 2/2010 |
| KR | 2010-0027067 A | 3/2010 |
| TW | 200841475 | 10/2008 |
| TW | 200845397 | 11/2008 |
| TW | 200929546 | 7/2009 |
| TW | 200941724 | 10/2009 |
| TW | 201005950 | 2/2010 |
| WO | WO-2004/114391 | 12/2004 |
| WO | WO-2008/069056 | 6/2008 |
| WO | WO-2008/069255 | 6/2008 |
| WO | WO-2008/105250 | 9/2008 |
| WO | WO-2009/041544 | 4/2009 |
| WO | WO-2009/072532 | 6/2009 |
| WO | WO-2009/136645 | 11/2009 |
| WO | WO-2009/139428 | 11/2009 |
| WO | WO-2011/118509 | 9/2011 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—An—Oxide TFT", AM-FPD '09 Digest of Technical Papers, Jul. 1, 2009, pp. 41-44.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg—Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

(56) References Cited

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7,8,9, and 16) in the In2O3—ZnGa2O4—ZnO System", Journal of Solid State Chemistry, Apr. 1, 1995, vol. 116, No. 1, pp. 170-178.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2011/056486) Dated Jun. 14, 2011.

Written Opinion (Application No. PCT/JP2011/056486) Dated Jun. 14, 2011.

Chinese Office Action (Application No. 201180016332.3) Dated Oct. 28, 2014.

Taiwanese Office Action (Application No. 100109133) Dated Jul. 23, 2015.

\* cited by examiner

METHOD FOR MANUFACTURING SEMICONDUCTOR DEVICE

CROSS-REFERENCE TO RELATED APPLICATIONS

This application is a continuation of U.S. application Ser. No. 14/024,721, filed Sep. 12, 2013, now allowed, which is a divisional of U.S. application Ser. No. 13/071,818, filed Mar. 25, 2011, now U.S. Pat. No. 8,551,810, which claims the benefit of a foreign priority application filed in Japan as Serial No. 2010-072532 on Mar. 26, 2010, all of which are incorporated by reference.

TECHNICAL FIELD

One embodiment of the present invention relates to a semiconductor device and a method for manufacturing the semiconductor device.

In this specification, a semiconductor device generally means a device which can function by utilizing semiconductor characteristics, and an electro-optic device, a semiconductor circuit, and an electronic device are all semiconductor devices.

BACKGROUND ART

Attention has been focused on a technique for forming a transistor (also referred to as a thin film transistor (TFT)) using a semiconductor thin film formed over a substrate having an insulating surface. Such a transistor is applied to a wide range of electronic devices such as an integrated circuit (IC) or an image display device (display device). As a semiconductor thin film applicable to the transistor, a silicon based semiconductor material is widely known; moreover, an oxide semiconductor has been attracting attention as another material.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

Patent Document

[Patent Document 1] Japanese Published Patent Application No. 2006-165528

DISCLOSURE OF INVENTION

However, the electric conductivity of an oxide semiconductor changes when deviation from the stoichiometric composition due to excess or deficiency of oxygen or the like occurs, or hydrogen or moisture forming an electron donor enters the oxide semiconductor during a thin film formation process. Such a phenomenon becomes a factor of variation in the electric characteristics of a transistor including the oxide semiconductor.

In view of the above problems, it is an object to provide a semiconductor device including an oxide semiconductor, which has stable electric characteristics and high reliability.

In addition, it is an object to prevent generation of a parasitic channel on the back channel side of an oxide semiconductor film.

In order to suppress variation in the electric characteristics of a transistor including an oxide semiconductor film, impurities such as hydrogen, moisture, a hydroxyl group, or hydride (also referred to as a hydrogen compound) which cause the variation are intentionally removed from the oxide semiconductor film. In addition, oxygen which is a main component of an oxide semiconductor and is reduced in the step of removing the impurities is supplied. The oxide semiconductor film is thus highly purified and becomes electrically I-type (intrinsic).

An I-type (intrinsic) oxide semiconductor is an oxide semiconductor which is made to be I-type (intrinsic) or substantially I-type (intrinsic) by being highly purified by removing hydrogen, which is an n-type impurity, from the oxide semiconductor so that impurities that are not a main component of the oxide semiconductor are contained as little as possible. In other words, a feature is that a highly purified I-type (intrinsic) oxide semiconductor or an oxide semiconductor close thereto is obtained not by adding impurities but by removing impurities such as hydrogen or water as much as possible. This enables the Fermi level (Ef) to be at the same level as the intrinsic Fermi level (Ei).

In the transistor including the oxide semiconductor film, an oxide layer for preventing electrification on a back channel side of the oxide semiconductor film is formed over and in contact with the oxide semiconductor film, oxygen is introduced (added) through the oxide layer, an insulating layer is formed over the oxide layer, and heat treatment is performed. This heat treatment may be performed before the insulating layer is formed over the oxide layer.

The oxide layer having a function of preventing electrification is provided on the back channel side (the side opposite to the gate insulating film side) of the oxide semiconductor film, preferably, the highly purified oxide semiconductor film, and the oxide layer preferably has a dielectric constant lower than that of the oxide semiconductor. For example, an oxide layer having a dielectric constant of 8 to 20 inclusive is used.

The oxide layer is thicker than the oxide semiconductor film. For example, provided that the thickness of the oxide semiconductor film is 3 nm to 30 nm inclusive, the thickness of the oxide layer is preferably more than 10 nm and more than or equal to the thickness of the oxide semiconductor film.

A metal oxide can be used for the oxide layer. As the metal oxide, for example, gallium oxide or gallium oxide to which indium or zinc is added at 0.01 at. % to 5 at. % can be used.

Through the oxygen introduction and the heat treatment described above, impurities such as hydrogen, moisture, a hydroxyl group, or hydride (also referred to as a hydrogen compound) are intentionally removed from the oxide semiconductor film, whereby the oxide semiconductor film is highly purified. By the introduction of oxygen, a bond between a metal included in the oxide semiconductor and hydrogen or a bond between the metal and a hydroxyl group is cut, and the hydrogen or the hydroxyl group reacts with oxygen to produce water; this leads to easy elimination of hydrogen or a hydroxyl group that is an impurity, in the form of water by heat treatment performed later.

Oxygen is introduced to the oxide semiconductor film through the metal oxide film stacked over the oxide semiconductor film, so that introduction depth (an introduction region) of oxygen can be controlled, and oxygen can be introduced to the oxide semiconductor film efficiently.

In addition, the metal oxide film containing oxygen and the oxide semiconductor film are in contact with each other when being subjected to the heat treatment; thus, oxygen which is one of the main components of the oxide semiconductor and is reduced in the step of removing impurities, can be supplied from the metal oxide film containing oxygen to the oxide semiconductor film. Thus, the oxide semiconductor film is highly purified to become I-type (intrinsic).

In order to prevent entry of impurities such as moisture or hydrogen into the oxide semiconductor film after the heat treatment, a protective insulating layer which prevents entry thereof from the outside may be further formed over the insulating layer.

The electric characteristics of the transistor including the highly purified oxide semiconductor film, such as the threshold voltage and the off-state current, have almost no temperature dependence. Further, the transistor characteristics hardly change owing to light deterioration.

As described above, variation in the electric characteristics of the transistor including the highly purified and electrically I-type (intrinsic) oxide semiconductor film is suppressed and the transistor is electrically stable. Consequently, a highly reliable semiconductor device including an oxide semiconductor, which has stable electric characteristics, can be provided.

The heat treatment is performed at a temperature of 250° C. to 650° C. inclusive, 450° C. to 600° C. inclusive, or less than the strain point of a substrate. The heat treatment may be performed in an atmosphere of nitrogen, oxygen, ultra-dry air (air in which the water content is 20 ppm or less, preferably 1 ppm or less, more preferably 10 ppb or less), or a rare gas (argon, helium, or the like).

One embodiment of a structure of the invention disclosed in this specification is a method for manufacturing a semiconductor device including the following steps: forming a gate electrode over a substrate; forming a gate insulating film which covers the gate electrode; forming an oxide semiconductor film in a region overlapping with the gate electrode with the gate insulating film interposed therebetween; forming a source electrode and a drain electrode over the oxide semiconductor film; forming a metal oxide film which is in contact with the oxide semiconductor film and covers the source electrode and the drain electrode; introducing oxygen to at least one of the oxide semiconductor film, the metal oxide film, and an interface between the oxide semiconductor film and the metal oxide film; forming an insulating film which covers the metal oxide film; and performing heat treatment.

Another embodiment of the structure of the invention disclosed in this specification is a method for manufacturing a semiconductor device including the following steps: forming a gate electrode over a substrate; forming a gate insulating film which covers the gate electrode; forming an oxide semiconductor film in a region overlapping with the gate electrode with the gate insulating film interposed therebetween; forming a source electrode and a drain electrode over the oxide semiconductor film; forming a metal oxide film which is in contact with the oxide semiconductor film and covers the source electrode and the drain electrode; forming an insulating film which covers the metal oxide film; introducing oxygen to at least one of the oxide semiconductor film, the metal oxide film, and an interface between the oxide semiconductor film and the metal oxide film; and performing heat treatment.

Further, another embodiment of the structure of the invention disclosed in this specification is a method for manufacturing a semiconductor device including the following steps: forming a gate electrode over a substrate; forming a gate insulating film which covers the gate electrode; forming an oxide semiconductor film in a region overlapping with the gate electrode with the gate insulating film interposed therebetween; performing first heat treatment including heating in an inert atmosphere and cooling in an oxygen atmosphere on the oxide semiconductor film; forming a source electrode and a drain electrode over the oxide semiconductor film; forming a metal oxide film which is in contact with the oxide semiconductor film and covers the source electrode and the drain electrode; introducing oxygen to at least one of the oxide semiconductor film, the metal oxide film, and an interface between the oxide semiconductor film and the metal oxide film; forming an insulating film which covers the metal oxide film; and performing second heat treatment.

Furthermore, another embodiment of the structure of the invention disclosed in this specification is a method for manufacturing a semiconductor device including the following steps: forming a gate electrode over a substrate; forming a gate insulating film which covers the gate electrode; forming an oxide semiconductor film in a region overlapping with the gate electrode with the gate insulating film interposed therebetween; performing first heat treatment including heating in an inert atmosphere and cooling in an oxygen atmosphere on the oxide semiconductor film; forming a source electrode and a drain electrode over the oxide semiconductor film; forming a metal oxide film which is in contact with the oxide semiconductor film and covers the source electrode and the drain electrode; forming an insulating film which covers the metal oxide film; introducing oxygen to at least one of the oxide semiconductor film, the metal oxide film, and an interface between the oxide semiconductor film and the metal oxide film; and performing second heat treatment.

In the above method for manufacturing a semiconductor device, a film containing gallium oxide is preferably formed as the metal oxide film.

Alternatively, in the above method for manufacturing a semiconductor device, a gallium oxide film containing 0.01 at. % to 5 at. % of indium or zinc is preferably formed as the metal oxide film.

In the above method for manufacturing a semiconductor device, the heat treatment temperature is preferably 450° C. to 600° C.

In the above method for manufacturing a semiconductor device, a film containing indium and gallium is preferably formed as the oxide semiconductor film.

In the above structure, a gallium oxide film is preferably used as the metal oxide film. The gallium oxide film can be formed by a sputtering method, a CVD method, an evaporation method, or the like. The gallium oxide film has an energy gap of about 4.9 eV and a light-transmitting property in the visible-light wavelength range, although depending on the composition ratio of oxygen and gallium.

In this specification, gallium oxide is represented by GaOx (x>0) in some cases. For example, when GaOx has a crystal structure, $Ga_2O_3$ in which x is 1.5 is known.

In the above structures, heat treatment may be performed on the oxide semiconductor film before the metal oxide film is formed over the oxide semiconductor film In addition, the introduction of oxygen can be performed by an ion implantation method or an ion doping method.

A metal oxide film is formed over and in contact with an oxide semiconductor film, oxygen is introduced through the metal oxide film and then, heat treatment is performed. Through these steps of oxygen introduction and heat treatment, impurities such as hydrogen, moisture, a hydroxyl group, or hydride can be intentionally removed from the oxide semiconductor film, whereby the oxide semiconductor film can be highly purified. Variation in the electric characteristics of a transistor including the highly purified and electrically I-type (intrinsic) oxide semiconductor film is suppressed and the transistor is electrically stable.

Therefore, according to one embodiment of the present invention, a transistor having stable electric characteristics can be manufactured.

In addition, according to one embodiment of the present invention, a semiconductor device including a transistor, which has favorable electric characteristics and high reliability, can be manufactured.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways. Further, the present invention is not construed as being limited to the description of the embodiments below.

Note that the ordinal numbers such as "first" and "second" in this specification are used for convenience and do not denote the order of steps and the stacking order of layers. In addition, the ordinal numbers in this specification do not denote particular names which specify the invention.
(Embodiment 1)

In this embodiment, one embodiment of a semiconductor device and a method for manufacturing the semiconductor device will be described with reference to FIGS. 1A to 1E. In this embodiment, a transistor including an oxide semiconductor film will be described as an example of the semiconductor device.

Figure 1A:
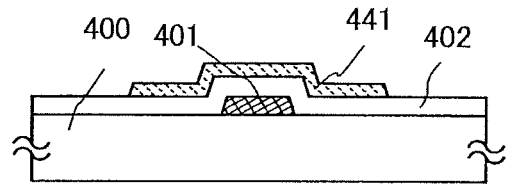
FIGS. 1A to 1E are diagrams illustrating one embodiment of a semiconductor device and a method for manufacturing the semiconductor device.
Figure 1B:
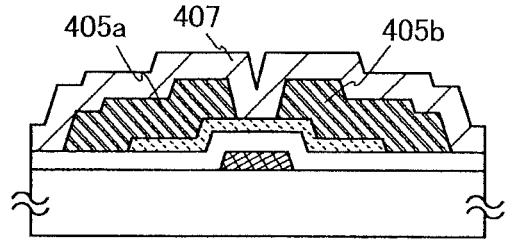
Figure 1C:
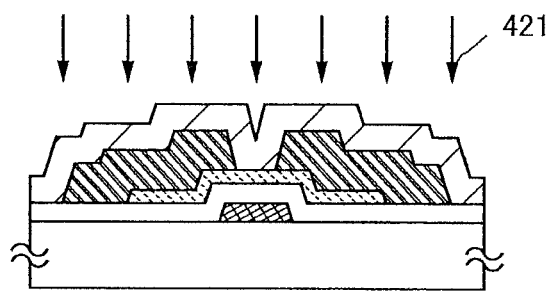
Figure 1D:
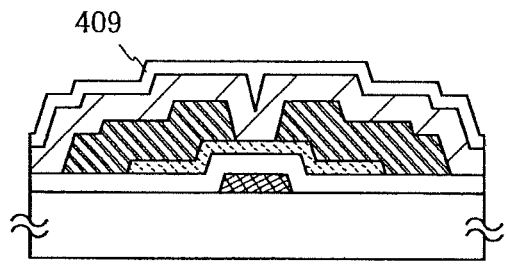
Figure 1E:
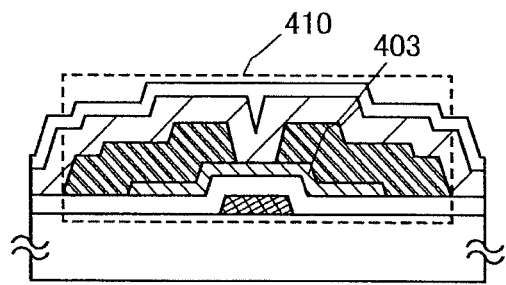

As illustrated in FIG. 1E, a transistor 410 includes a gate electrode 401, a gate insulating film 402, an oxide semiconductor film 403, a source electrode 405a, and a drain electrode 405b, which are formed over a substrate 400 having an insulating surface. A metal oxide film 407 for preventing electrification on a back channel side of the oxide semiconductor film 403 and an insulating film 409 are stacked in this order over the oxide semiconductor film 403.

FIGS. 1A to 1E illustrate an example of a method for manufacturing the transistor 410.

First, a conductive film is formed over the substrate 400 having an insulating surface, and then, the gate electrode 401 is formed by a first photolithography step. Note that a resist mask may be formed by an inkjet method. Formation of the resist mask by an inkjet method needs no photomask; thus, manufacturing cost can be reduced.

Although there is no particular limitation on a substrate which can be used as the substrate 400 having an insulating surface, it is necessary that the substrate have at least enough heat resistance to heat treatment performed later. For example, a substrate such as a glass substrate, a ceramic substrate, a quartz substrate, a sapphire substrate, or the like can be used. Alternatively, a single crystal semiconductor substrate or a polycrystalline semiconductor substrate of silicon, carbon silicon, or the like; a compound semiconductor substrate of silicon germanium or the like; an SOI substrate; or the like can be used as long as the substrate has an insulating surface. In addition, semiconductor elements may be provided over these substrates.

A flexible substrate may be used as the substrate 400. In the case where a flexible substrate is used, the transistor 410 including the oxide semiconductor film 403 may be directly formed over a flexible substrate. Alternatively, the transistor 410 including the oxide semiconductor film 403 may be formed over a manufacturing substrate, and then, the transistor 410 may be separated and transferred to a flexible substrate. Note that in order to separate the transistor from the manufacturing substrate and transfer it to the flexible substrate, a separation layer may be provided between the manufacturing substrate and the transistor including the oxide semiconductor film.

An insulating film serving as a base film may be provided between the substrate 400 and the gate electrode 401. The base film has a function of preventing diffusion of an impurity element from the substrate 400, and can be formed with a single-layer structure or a stacked-layer structure using one or more of a silicon nitride film, a silicon oxide film, a silicon nitride oxide film, and a silicon oxynitride film.

The gate electrode 401 can be formed to have a single-layer structure or a stacked-layer structure using a metal material such as molybdenum, titanium, tantalum, tungsten, aluminum, copper, neodymium, or scandium, or an alloy material which contains any of these materials as a main component.

Next, the gate insulating film 402 is formed over the gate electrode 401. The gate insulating film 402 can be formed to have a single-layer structure or a stacked-layer structure using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by a plasma CVD method, a sputtering method, or the like.

In this embodiment, an intrinsic (I-type) or substantially intrinsic (I-type) oxide semiconductor from which impurities are removed and which is highly purified so as to contain impurities that serve as a carrier donor and are substances other than the main component of the oxide semiconductor as little as possible is used as the oxide semiconductor film 403.

Such a highly purified oxide semiconductor is extremely sensitive to an interface state or interface charge; thus, an interface between the oxide semiconductor film and the gate insulating film is important. Thus, the gate insulating film which is in contact with a highly purified oxide semiconductor needs to have high quality.

For the method for manufacturing the gate insulating film, a high-density plasma CVD method using microwaves (e.g., with a frequency of 2.45 GHz) is preferably employed because an insulating layer which is formed can be dense and can have high breakdown voltage and high quality. This is because when the highly purified oxide semiconductor is closely in contact with the high-quality gate insulating film, the interface state can be reduced and the interface characteristics can be favorable.

Needless to say, a different film formation method such as a sputtering method or a plasma CVD method can be used as long as a high-quality insulating layer can be formed as the gate insulating film. Further, an insulating layer may be formed, whose film quality and interface characteristics with the oxide semiconductor are improved by heat treatment which is performed after film formation. In either case, any gate insulating film can be used as long as film quality as the gate insulating film is high, interface state density with an oxide semiconductor is decreased, and a favorable interface can be formed.

In order that hydrogen, a hydroxyl group, and moisture are contained as little as possible in the gate insulating film 402 and the oxide semiconductor film, it is preferable that the substrate 400 over which the gate electrode 401 is formed or the substrate 400 over which films up to the gate insulating film 402 are formed be preheated in a preheating chamber of a sputtering apparatus as pretreatment for the formation of the oxide semiconductor film, so that impurities such as hydrogen and moisture absorbed onto the substrate 400 are eliminated and removed. As an evacuation unit provided in the preheating chamber, a cryopump is preferable. Note that this preheating treatment can be omitted. Similarly, this preheating treatment may be performed on the substrate 400 over which films up to the source electrode 405a and the drain electrode 405b are formed (before forming the metal oxide film 407) in a later step.

Next, an oxide semiconductor film having a thickness of 3 nm to 30 nm inclusive is formed over the gate insulating film 402 by a sputtering method. The thickness in the above range is preferable because when the thickness of the oxide semiconductor film is too large (for example, when the thickness is 50 nm or more), the transistor might be normally on.

Note that before the oxide semiconductor film is formed by a sputtering method, powdery substances (also referred to as particles or dust) which are attached on the surface of the gate insulating film 402 are preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma in the vicinity of the substrate to modify a surface. Note that instead of an argon atmosphere, a nitrogen atmosphere, a helium atmosphere, an oxygen atmosphere, or the like may be used.

As the oxide semiconductor used for the oxide semiconductor film, the following oxide semiconductors can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor; a Sn—O-based oxide semiconductor; a Zn—O-based oxide semiconductor; and the like. Further, $SiO_2$ may be contained in the above oxide semiconductor. Note that here, for example, an In—Ga—Zn—O-based oxide semiconductor means an oxide film including indium (In), gallium (Ga), and zinc (Zn) and there is no particular limitation on the composition ratio. The In—Ga—Zn—O-based oxide semiconductor may contain an element other than In, Ga, and Zn.

In addition, as the oxide semiconductor film, a thin film of a material represented by the chemical expression, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

When an In—Ga—Zn—O-based material is used for the oxide semiconductor, for example, an oxide target having a composition ratio of $In_2O_3$: $Ga_2O_3$: ZnO=1:1:1 [molar ratio] can be used as a target. Without limitation on the material and the component of the target, for example, an oxide target having a composition ratio of $In_2O_3$: $Ga_2O_3$: ZnO=1:1:2 [molar] ratio may be used.

In the case where an In—Zn—O-based material is used as the oxide semiconductor, a target therefor has a composition ratio of In: Zn=50:1 to 1:2 in an atomic ratio ($In_2O_3$: ZnO=25:1 to 1:4 in a molar ratio), preferably, In: Zn=20:1 to 1:1 in an atomic ratio ($In_2O_3$: ZnO=10:1 to 1:2 in a molar ratio), further preferably, In: Zn=15:1 to 1.5:1 in an atomic ratio ($In_2O_3$: ZnO=15:2 to 3:4 in a molar ratio). For example, in a target used for formation of an In—Zn—O-based oxide semiconductor having an atomic ratio of In: Zn: O=X: Y: Z, the relation of Z>1.5X+Y is satisfied.

Further, the filling rate of the target is 90% to 100% inclusive, preferably 95% to 99.9% inclusive. With use of the target with high filling rate, a dense oxide semiconductor film can be formed.

In this embodiment, the oxide semiconductor film is formed by a sputtering method with the use of an In—Ga—Zn—O-based oxide target. Further, the oxide semiconductor film can be formed by a sputtering method in a rare gas (typically, argon) atmosphere, an oxygen atmosphere, or a mixed atmosphere of a rare gas and oxygen.

It is preferable that a high-purity gas from which impurities such as hydrogen, water, a hydroxyl group, or hydride have been removed be used as a sputtering gas used for forming the oxide semiconductor film.

For the film formation of the oxide semiconductor film, the substrate 400 is set in a film formation chamber at reduced pressure, and the substrate temperature is preferably set 100° C. to 600° C. inclusive, preferably 200° C. to 400° C. inclusive. The film formation is performed while the substrate 400 is heated, whereby the concentration of impurities contained in the oxide semiconductor film formed can be reduced. In addition, damage by sputtering can be reduced. Then, moisture remaining in the film formation chamber is removed, a sputtering gas from which hydrogen and moisture are removed is introduced, and the above target is used, so that the oxide semiconductor film is formed over the substrate 400. In order to remove moisture remaining in the film formation chamber, an entrapment vacuum pump such as a cryopump, an ion pump, or a titanium sublimation pump is preferably used. Further, an evacuation unit may be a turbo pump provided with a cold trap. In the film formation chamber which is evacuated with the cryopump, a hydrogen atom, a compound containing a hydrogen atom, such as water ($H_2O$), (more preferably, also a compound containing a carbon atom), and the like are removed, whereby the concentration of impurities contained in the oxide semiconductor film formed in the film formation chamber can be reduced.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current power source is preferably used, in which case powder substances (also referred to as particles or dust) generated in film formation can be reduced and the film thickness can be uniform.

Next, the oxide semiconductor film is processed into an island-shaped oxide semiconductor film 441 through a second photolithography step (see FIG. 1A). A resist mask for forming the island-shaped oxide semiconductor film 441 may be formed by an inkjet method. Formation of the resist mask by an inkjet method needs no photomask; thus, manufacturing cost can be reduced.

Note that here, the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. In addition, ITO-07N (produced by KANTO CHEMICAL CO., INC.) may also be used.

Next, a conductive film for forming a source electrode and a drain electrode (including a wiring formed in the same layer as the source electrode and the drain electrode) is formed over the gate insulating film 402 and the oxide semiconductor film 441. As the conductive film used for the source electrode and the drain electrode, for example, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like can be used. Alternatively, a film of a high-melting-point metal such as Ti, Mo, or W or a metal nitride film (e.g., a titanium nitride film, a molybdenum nitride film, or a tungsten nitride film) may be formed over or/and below the metal film such as an Al film or a Cu film. Further, the conductive film used for the source electrode and the drain electrode may be formed using a conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

Note that it is preferable that a material of the source electrode and the drain electrode be selected in consideration of the electron affinity of the oxide semiconductor and the electron affinity of the metal oxide film. That is, when the work function of the material of the source electrode and the drain electrode is W [eV], the electron affinity of the oxide semiconductor is $\phi_1$ [eV], and the electron affinity of the metal oxide film is $\phi_2$ [eV], it is preferable that the following inequality be satisfied: $\phi_2+0.4<W<(\phi_1+0.5)$, preferably $(\phi_2+0.9)<W<(\phi_1+0.4)$. For example, when a material whose electron affinity is 4.5 eV and a material whose electron affinity is 3.5 eV are used for the oxide semiconductor and the metal oxide film respectively, a metal or a metal compound whose work function is more than 3.9 eV and less than 5.0 eV, preferably more than 4.4 eV and less than 4.9 eV inclusive is preferably used for the material of the source electrode and the drain electrode. Thus, in the transistor 410, electrons can be prevented from being injected into the metal oxide film 407 from the source electrode 405a and the drain electrode 405b, and generation of leakage current can be suppressed. In addition, favorable electric characteristics can be obtained at a junction between the oxide semiconductor film and the source and drain electrodes. For a material having such a work function, molybdenum nitride, tungsten nitride, or the like can be given, for example. These materials are preferable because they are also excellent in heat resistance. Note that from the above inequality, an inequality $\phi_2<(\phi_1+0.1)$, preferably an inequality $\phi_2<(\phi_1-0.5)$ is derived, but it is more preferable that an inequality $\phi_2<(\phi_1-0.9)$ be satisfied.

A resist mask is formed over the conductive film by a third photolithography step. Etching is selectively performed, so that the source electrode 405a and the drain electrode 405b are formed. Then, the resist mask is removed (see FIG. 1B).

Light exposure at the time of the formation of the resist mask in the third photolithography step may be performed using ultraviolet light, KrF laser light, or ArF laser light. Each channel length L of the transistor to be formed in a later step is determined by a distance between a lower end of the source electrode and a lower end of the drain electrode that are adjacent to each other over the oxide semiconductor film 441. In the case where light exposure is performed for a channel length L of less than 25 nm, the light exposure at the time of the formation of the resist mask in the third photolithography step may be performed using extreme ultraviolet light having an extremely short wavelength of several nanometers to several tens of nanometers. In the light exposure by extreme ultraviolet light, the resolution is high and the focus depth is large. For these reasons, the channel length L of the transistor to be formed later can be in the range of 10 nm to 1000 nm inclusive, and the circuit can operate at higher speed.

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Consequently, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Note that it is preferable that etching conditions be optimized so as not to etch and divide the oxide semiconductor film 441 when the conductive film is etched. However, it is difficult to obtain etching conditions in which only the conductive film is etched and the oxide semiconductor film 441 is not etched at all. In some cases, only part of the oxide semiconductor film 441 is etched to be an oxide semiconductor film having a groove portion (a recessed portion) when the conductive film is etched.

In this embodiment, since a Ti film is used as the conductive film and an In—Ga—Zn—O-based oxide semiconductor is used as the oxide semiconductor film 441, ammonium hydrogen peroxide (a mixture of ammonia, water, and hydrogen peroxide) is used as an etchant.

Next, by plasma treatment using a gas such as $N_2O$, $N_2$, or Ar, water or the like absorbed on a surface of an exposed portion of the oxide semiconductor film may be removed. In the case where plasma treatment is performed, the metal oxide film 407 in contact with part of the oxide semiconductor film 441 is preferably formed following the plasma treatment without exposure to the air.

Then the metal oxide film 407 is formed, which covers the source electrode 405a and the drain electrode 405b and is in contact with part of the oxide semiconductor film 441. Note that the thickness of the metal oxide film 407 is made larger than that of the oxide semiconductor film 441. The metal oxide film 407 is in contact with the back channel side of the oxide semiconductor film 441, that is, part of the oxide semiconductor film 441 which is between the source electrode 405a and the drain electrode 405b. The metal oxide film 407 is a film removing charges accumulated at the interface with the oxide semiconductor film 441.

A positive charge is moved from the source electrode 405a or the drain electrode 405b to the oxide semiconductor film due to a potential (a charge) accumulated in the source electrode 405a or the drain electrode 405b, so that the interface at the back channel side of the oxide semiconductor film might be electrified. In particular, when the electric conductivity of an oxide semiconductor film and the electric conductivity of a material layer in contact with a back channel side of the oxide semiconductor film are different from each other, a charge flows to the oxide semiconductor film, and the charge is trapped at the interface and is combined with hydrogen in the oxide semiconductor film to be a donor center of the interface. Consequently, there is a problem in that characteristics of a transistor vary. Therefore, both reduction of hydrogen and prevention of electrification in the oxide semiconductor film are important.

The difference between the physical property value of the oxide semiconductor film and the physical property value of the metal oxide film is preferably small. Here, the physical value means a work function, an electron affinity, a dielectric constant, a band gap, and the like. Specifically, the difference between the band gap of the oxide semiconductor film and the band gap of the metal oxide film is preferably less than 3 eV. For example, in the case where an In—Ga—Zn—O-based oxide semiconductor is used as the oxide semiconductor film and silicon oxide or aluminum oxide is used as the metal oxide film, since the band gap of the In—Ga—Zn—O-based oxide semiconductor is 3.15 eV, and the band gap of the silicon oxide or aluminum oxide is 8 eV, the above-described problem might occur. Further, when a film containing nitride (such as a silicon nitride film) is used instead of the metal oxide film, the electric conductivity of the oxide semiconductor film might change owing to a contact between the film containing nitride and the oxide semiconductor film.

The metal oxide film 407 is a film having a property of removing a positive charge immediately when the back channel side is positively charged. Note that as a material of the metal oxide film 407, a material whose hydrogen content is smaller than or equal to that of the oxide semiconductor film or is not larger than that of the oxide semiconductor film by an order of magnitude or more, and whose energy gap is more than or equal to that of a material of the oxide semiconductor film is preferably used.

As described above, with the use of the metal oxide film 407 for preventing electrification, flow of charges from the material layer in contact with the back channel side of the oxide semiconductor film 403 to the oxide semiconductor film 403 can be suppressed. Further, even the back channel side of the oxide semiconductor film 403 is positively charged, a positive charge can be removed immediately by forming the metal oxide film 407 over a top surface of the oxide semiconductor film. Furthermore, with the use of the metal oxide film 407, generation of a parasitic channel on the back channel side of the oxide semiconductor film 403 can be prevented. Consequently, variation in the electric characteristics of the oxide semiconductor film 403, such as the electric conductivity and the threshold voltage, can be suppressed, whereby reliability of the transistor 410 can be improved.

In this embodiment, a gallium oxide film obtained by a sputtering method using a pulse direct current (DC) power source is used as the metal oxide film 407. Note that a gallium oxide target is preferably used as a target used for the sputtering method. The electric conductivity of the metal oxide film 407 may be appropriately adjusted by adding In or Zn to the metal oxide film 407, in accordance with the electric conductivity of the oxide semiconductor film which is used. For example, a film containing 0.01 at. % to 5 at. % of indium or zinc is formed by a sputtering method using a target obtained by adding indium or zinc to gallium oxide. When the electric conductivity of the metal oxide film 407 is improved and is brought close to the electric conductivity of the oxide semiconductor film 403 by adding indium or zinc, the accumulated charges can be more reduced.

The band gap of gallium oxide is 3.0 eV to 5.2 eV (for example, 4.9 eV), the dielectric constant thereof is 10 to 12, and the electron affinity thereof is 3.5 eV. The band gap of In—Ga—Zn—O-based oxide semiconductor is 3.15 eV, the dielectric constant thereof is 15, and the electron affinity thereof is 3.5 eV. Thus, the difference between the physical property value of the gallium oxide film and the physical property value of the oxide semiconductor film is small, which is preferable. Since gallium oxide has a wide band gap of about 4.9 eV, it has light-transmitting properties in a visible light wavelength region. Further, it is preferable that gallium oxide be used as the metal oxide film because contact resistance between an In—Ga—Zn—O-based oxide semiconductor film and a gallium oxide film can be reduced. In the case where gallium oxide is used as the metal oxide film, In—Ga—O-based oxide semiconductor or Ga—Zn—O-based oxide semiconductor may be used as the oxide semiconductor material other than In—Ga—Zn—O-based oxide semiconductor.

In particular, in the case where an In—Ga—Zn—O film is used as the oxide semiconductor film, since the In—Ga—Zn—O film contains a gallium element which is common with GaOx used as the metal oxide film 407, materials of the oxide semiconductor film and the metal oxide film are compatible with each other.

The metal oxide film 407 is preferably formed by using a method with which impurities such as water and hydrogen do not enter the metal oxide film 407. When hydrogen is contained in the metal oxide film 407, entry of the hydrogen to the oxide semiconductor film or extraction of oxygen in the oxide semiconductor film by the hydrogen is caused; thus, the back channel of the oxide semiconductor film might have low resistance (n-type conductivity) and a parasitic channel might be formed. Therefore, it is important that hydrogen is not used in a film formation method so that the metal oxide film 407 contains hydrogen as little as possible.

In this embodiment, as the metal oxide film 407, a gallium oxide film having a thickness of more than 10 nm and more than or equal to that of the oxide semiconductor film 441 is formed by a sputtering method. This is because the metal oxide film 407 can release a charge efficiently by increasing the thickness of the metal oxide film 407 in such a manner. The substrate temperature at the time of film formation may be in the range of room temperature to 300° C. inclusive. The gallium oxide film can be formed by a sputtering method in a rare gas (typically, argon) atmosphere, an oxygen atmosphere, or a mixed atmosphere containing a rare gas and oxygen.

In order to remove remaining moisture from a film formation chamber of the metal oxide film 407 in a manner similar to that of the film formation of the oxide semiconductor film, an entrapment vacuum pump (such as a cryopump) is preferably used. When a cryopump is used to evacuate the film formation chamber where the metal oxide film 407 is formed, the impurity concentration of the metal oxide film 407 can be reduced. In addition, as an evacuation unit for removing the remaining moisture from the film formation chamber of the metal oxide film 407, a turbo pump provided with a cold trap may be used.

It is preferable that a high-purity gas from which impurities such as hydrogen, water, a hydroxyl group, or hydride are removed be used as a sputtering gas when the metal oxide film 407 is faulted.

The metal oxide film 407 may cover at least the channel formation region of the oxide semiconductor film, the source electrode 405a, and the drain electrode 405b. If needed, the metal oxide film 407 may be selectively removed. Note that known wet etching or known dry etching can be used for etching of the gallium oxide film used in this embodiment. For example, wet etching is performed using a hydrofluoric acid solution or a nitric acid solution.

Next, oxygen 421 is introduced to at least one of the oxide semiconductor film 441, the metal oxide film 407, and the interface between the oxide semiconductor film 441 and the metal oxide film 407, through the metal oxide film 407 (see FIG. 1C).

As a method for introducing the oxygen 421, an ion implantation method, an ion doping method, or the like can be used. In an ion implantation method, a source gas is made into plasma, ion species included in this plasma are extracted and mass-separated, and ion species with predetermined mass are accelerated and implanted into an object to be processed as an ion beam. In an ion doping method, a source gas is made into plasma, ion species are extracted from this plasma by an operation of a predetermined electric field, and the extracted ion species are accelerated without mass separation and implanted into an object to be processed as an ion beam. When the introduction of oxygen is performed using an ion implantation method involving mass-separation, an impurity such as a metal element can be prevented from being added, together with oxygen, into the oxide semiconductor film. In addition, an ion doping method enables ion-beam irradiation to a larger area than an ion implantation method; therefore, when the addition of oxygen is performed using an ion doping method, the takt time can be shortened.

Since oxygen is introduced to the oxide semiconductor film 441 through the metal oxide film 407 stacked over the oxide semiconductor film 441, introduction depth (an introduction region) of oxygen can be controlled; thus, oxygen can be introduced to the oxide semiconductor film 441 efficiently. The introduction depth of oxygen can be controlled by appropriately setting an introduction condition such as acceleration voltage and a dose or the thickness of the metal oxide film 407 through which oxygen passes.

Subsequently, the insulating film 409 is formed over the metal oxide film 407 (see FIG. 1D). As the insulating film 409, an inorganic insulating film is used, and a single layer or a stacked layer using one or more of oxide insulating films such as a silicon oxide film, a silicon oxynitride film, an aluminum oxide film, and an aluminum oxynitride film, or nitride insulating films such as a silicon nitride film, a silicon nitride oxide film, an aluminum nitride film, and an aluminum nitride oxide film may be used. For example, a silicon oxide film and a silicon nitride film are stacked in this order over the metal oxide film 407 by a sputtering method.

Note that the above oxygen introduction treatment may be performed after the insulating film 409 is formed over the metal oxide film 407.

Next, the oxide semiconductor film 441 to which oxygen is introduced is subjected to heat treatment while part (the channel formation region) of the oxide semiconductor film 441 is in contact with the metal oxide film 407 (see FIG. 1E).

The heat treatment is performed at 250° C. to 650° C. inclusive, preferably 450° C. to 600° C. inclusive, or lower than the strain point of the substrate. For example, after the substrate is put in an electric furnace which is a kind of heat treatment apparatus, the oxide semiconductor film is subjected to heat treatment at 450° C. for one hour in a nitrogen atmosphere.

Note that a heat treatment apparatus used is not limited to an electric furnace, and a device for heating an object to be processed by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used. Note that in the case where a GRTA apparatus is used as the heat treatment apparatus, the substrate may be heated in an inert gas heated to high temperature of 650° C. to 700° C. because the heat treatment time is short.

The heat treatment may be performed in an atmosphere of nitrogen, oxygen, ultra-dry air (air in which a water content is 20 ppm or lower, preferably 1 ppm or lower, more preferably 10 9ppb or lower), or a rare gas (argon, helium, or the like). Note that it is preferable that water, hydrogen, or the like be not contained in the atmosphere of nitrogen, oxygen, ultra-dry air, or a rare gas. It is preferable that the purity of nitrogen, oxygen, or the rare gas which is introduced into a heat treatment apparatus be set to 6N (99.9999%) or higher, preferably 7N (99.99999%) or higher (that is, the concentration of an impurity is 1 ppm or lower, preferably 0.1 ppm or lower).

As described above, oxygen is introduced to at least one of the oxide semiconductor film 441, the metal oxide film 407, and the interface between the oxide semiconductor film 441 and the metal oxide film 407 and after that, the heat treatment is performed; thus, dangling bonds existing in the oxide semiconductor film 441, the metal oxide film 407, or the interface between the oxide semiconductor film 441 and the metal oxide film 407 can be terminated by oxygen. When dangling bonds exist in the oxide semiconductor film 441, the metal oxide film 407, or the interface between the oxide semiconductor film 441 and the metal oxide film 407, hydrogen might diffuse and bonds might be formed; however, formation of the bonds can be prevented by terminating the dangling bonds by oxygen.

By the introduction of oxygen, a bond between a metal included in the oxide semiconductor and hydrogen or a bond between the metal and a hydroxyl group is cut, and the hydrogen or the hydroxyl group reacts with oxygen to produce water. Consequently, hydrogen or a hydroxyl group that is an impurity can be easily eliminated as water by the heat treatment.

In such a manner, formation of bonds can be prevented, the oxide semiconductor film can be dehydrated or dehydrogenated, and impurities such as hydrogen, moisture, a hydroxyl group, or hydride can be removed from an oxide semiconductor film by the oxygen introduction and the heat treatment.

In addition, the oxide semiconductor film and the metal oxide film 407 containing oxygen are in contact with each other when being subjected to the heat treatment; thus, oxygen which is one of the main components of the oxide semiconductor and is reduced in the step of removing impurities, can be supplied from the metal oxide film 407 containing oxygen to the oxide semiconductor film. Consequently, a charge trapping center in the oxide semiconductor film can be reduced. Through the above steps, the oxide semiconductor film 403 which is highly purified and is made electrically I-type (intrinsic) can be obtained. In addition, impurities are removed from the metal oxide film 407 at the same time by this heat treatment, and the metal oxide film 407 can be highly purified.

The highly purified oxide semiconductor film 403 includes extremely few carriers (close to 0) derived from a donor. The carrier concentration of the oxide semiconductor film 403 is less than $1\times10^{14}/cm^3$, preferably less than $1\times10^{12}/cm^3$, further preferably less than $1\times10^{11}/cm^3$.

Distortion of atomic arrangement in the vicinity of the interface between the oxide semiconductor film 441 and the metal oxide film 407 is generated by adding oxygen through the metal oxide film 407. After that, the atoms in the vicinity of the interface between the oxide semiconductor film 403 and the metal oxide film 407 are rearranged by the heat treatment. At this time, atoms of the oxide semiconductor film 403 and the metal oxide film 407 bond together, so that the difference of the physical property value such as electric conductivity of the oxide semiconductor film 403 and that of the metal oxide film 407 can be decreased, and electrification on the back channel side of the oxide semiconductor film can be prevented. As a result, variation in the electric characteristics of the oxide semiconductor film such as the threshold voltage can be suppressed, whereby reliability of the transistor can be improved.

Through the above steps, the transistor 410 is formed (see FIG. 1E). The transistor 410 is a transistor including the oxide semiconductor film 403 from which impurities such as hydrogen, moisture, a hydroxyl group, or hydride (also referred to as a hydrogen compound) are intentionally removed and which is highly purified. Consequently, variation in the electric characteristics of the transistor 410 is suppressed and the transistor 410 is electrically stable.

Note that the heat treatment performed after the oxygen introduction may be performed before the formation of the insulating film 409. In this case, the insulating film 409 is formed over the metal oxide film 407 after the heat treatment.

The other heat treatment may be performed in addition to the above heat treatment. For example, heat treatment (first heat treatment) may be performed after the oxide semiconductor film 441 is formed, and heat treatment (second heat treatment) may be further performed after the metal oxide film 407 is formed. In this case, the first heat treatment can be treatment in which heating is performed in an inert gas atmosphere, and cooling is performed in an oxygen atmosphere (in an atmosphere at least containing oxygen), for example. When such first heat treatment is used, dehydration and supply of oxygen can be favorably performed on the oxide semiconductor film.

After the step of FIG. 1E, heat treatment may be further performed. For example, the heat treatment may be performed at 100° C. to 200° C. inclusive for one hour to 30 hours inclusive in the air. This heat treatment may be performed at fixed heating temperature. Alternatively, the following change in the heating temperature may be conducted plural times repeatedly: the heating temperature is increased from room temperature to temperature of 100° C. to 200° C. and then decreased to room temperature.

The field-effect mobility of the transistor 410 including the oxide semiconductor film 403 can be relatively high, so that high-speed operation is possible. Consequently, when the above transistor is used in a pixel portion, high-quality images can be provided. In addition, a driver circuit portion and a pixel portion which include the transistors including a highly purified oxide semiconductor film can be formed over one substrate; thus, the number of components of the semiconductor device can be reduced.

In the transistor 410 having the metal oxide film 407, generation of a parasitic channel on the back channel side of the oxide semiconductor film 403 can be prevented. Moreover, by preventing the generation of a parasitic channel on the back channel side of the oxide semiconductor film 403 in the transistor 410, variation in the threshold voltage can be suppressed, whereby reliability of the transistor can be improved.

Figure 9A:
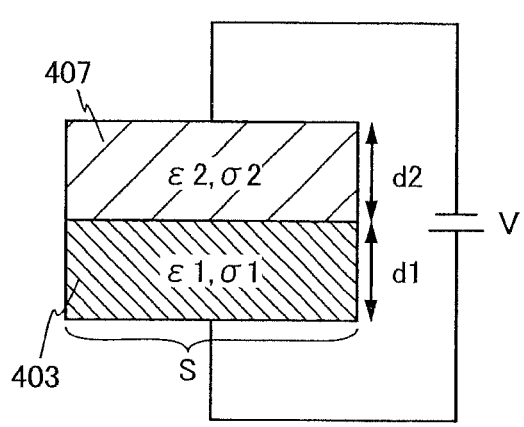
FIG. 9A is a model diagram illustrating a stacked-layer structure of dielectrics and FIG. 9B is an equivalent circuit diagram.
Figure 9B:
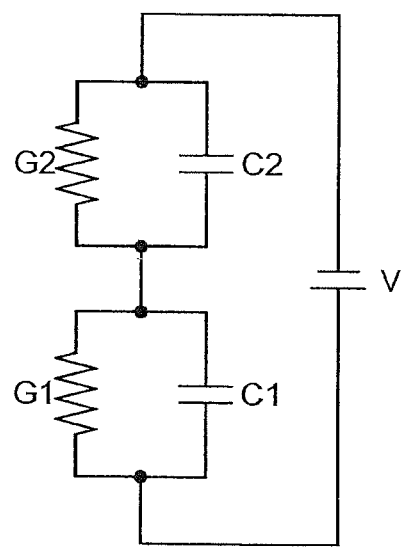

In the transistor 410 illustrated in FIG. 1E, two dielectric layers, the oxide semiconductor film 403 and the metal oxide film 407, are provided in contact with each other. In the case where two different dielectric layers are stacked, the stacked two layers can be expressed as in a model diagram in FIG. 9A when the dielectric constant, the electric conductivity, and the thickness of a first layer (the oxide semiconductor film 403 in the transistor 410) are set to $\epsilon_1$, $\sigma_1$, and $d_1$ respectively, and the dielectric constant, the electric conductivity, and the thickness of a second layer (the metal oxide film 407 in the transistor 410) are set to $\epsilon_2$, $\sigma_2$, and $d_2$ respectively. Note that in FIG. 9A, S represents an area. The model diagram in FIG. 9A can be replaced with an equivalent circuit in FIG. 9B. $C_1$, $G_1$, $C_2$, and $G_2$ in the drawing represent the capacitance value of the first layer, the resistance value of the first layer, the capacitance value of the second layer, and the resistance value of the second layer respectively. Here, it is considered that in the case where a voltage V is applied to the two layers, a charge Q expressed by the following equation (1) is accumulated at the interface between the two layers after t seconds.

$$Q = \frac{C_2 G_1 - C_1 G_2}{G_1 + G_2} V \times \left\{1 - \exp\left(-\frac{G_1 + G_2}{C_1 + C_2}t\right)\right\} \quad (1)$$

In the transistor 410 illustrated in FIG. 1E, the interface at which the charge Q is accumulated corresponds to the back channel side of the oxide semiconductor film 403. The charge Q accumulated at the interface on the back channel side can be decreased by appropriately setting the dielectric constant, the electric conductivity, or the thickness of the metal oxide film 407.

Here, the equation (1) is modified into equations (2) and (3).

$$Q = \left(1 - \frac{\tau_1}{\tau_2}\right) C_2 V_2 \times \left\{1 - \exp\left(-\frac{t}{\tau_i}\right)\right\} \quad (2)$$

$$V_2 = \frac{G_1}{G_1 + G_2} V \quad (3)$$

$$\left(\text{Note that } C_1 = \frac{\varepsilon_1}{d_1}S, \ C_2 = \frac{\varepsilon_2}{d_2}S, \ G_1 = \frac{\sigma_1}{d_1}S, \ G_2 = \frac{\sigma_2}{d_2}S, \ \tau_1 = \frac{\varepsilon_1}{\sigma_1}, \right.$$
$$\left. \tau_2 = \frac{\varepsilon_2}{\sigma_2}, \ \tau_i = \frac{C_1 + C_2}{G_1 + G_2}\right)$$

From the equations (2) and (3), four conditions (A) to (D) can be assumed in order to decrease the charge Q.

Condition (A): $\tau_1$ is extremely large.

Condition (B): $V_2$ is close to zero, that is, $G_2$ is much larger than $G_1$.

Condition (C): $C_2$ is close to zero.
Condition (D): $\tau_1$ is close to $\tau_2$.

In order to make $\tau_1$ extremely large under the condition (A), because of $\tau_1=(C_1+C_2)/(G_1+G_2)$, $(C_1+C_2)$ may be made extremely larger than $(G_1+G_2)$. Since $C_1$ and $G_1$ are parameters of the oxide semiconductor film 403, $C_2$ needs to be increased in order to decrease the charge Q by the metal oxide film 407. However, when $C_2$ is increased by $\epsilon_2$ from $C_2=\epsilon_2 S/d_2$, Q becomes large from the equation (2), so that there is a contradiction. In other words, the charge Q cannot be adjusted by $\tau_1$.

In order to make $V_2$ close to zero under the condition (B), $G_2 \gg G_1$ may be satisfied from the equation (3). Since $G_1$ is a parameter of the oxide semiconductor film 403, $G_2$ needs to be increased in order to decrease the charge Q by the metal oxide film 407. Specifically, $d_2$ is decreased or a material in which $\sigma_2$ is large is selected because $G_2=\sigma_2 S/d_2$. However, when $d_2$ is decreased, $C_2$ is increased from $C_2=\epsilon_2 S/d_2$, so that Q becomes large as in the case of the condition (A) and a decrease in $d_2$ cannot be employed. In addition, when $\sigma_2$ is large, the electric conductivity of the metal oxide film 407 is larger than that of the oxide semiconductor film 403, which leads to generation of a leakage current and a short circuit with a high probability; thus, a material in which $\sigma_2$ is large cannot be employed.

In order to make $C_2$ extremely small under the condition (C), from $C_2=\epsilon_2 S/d_2$, $d_2$ is increased or a material in which $\epsilon_2$ is small is selected.

In order to make $\tau_1$ close to $\tau_2$ under the condition (D), since $\tau_1=\epsilon_1/\sigma_1$ and $\tau_2=\epsilon_2/\sigma_2$, a film which satisfies $\epsilon_1/\sigma_1 \approx \epsilon_2/\sigma_2$ may be selected. This is equivalent to $C_1/G_1 \approx C_2/G_2$.

Consequently, in order to prevent the accumulation of the charge Q efficiently, it is preferable that the thickness ($d_2$) of the metal oxide film 407 be increased or a material whose dielectric constant ($\epsilon_2$) is small, preferably a material whose dielectric constant is smaller than that of the oxide semiconductor film 403 (for example, a material whose dielectric constant $\epsilon$ is 8 to 20 inclusive) be selected as a material of the metal oxide film 407. Alternatively, a material whose physical property value is close to that of the oxide semiconductor film is preferably selected as a material of the metal oxide film so as to satisfy $\epsilon_1/\sigma_1 \approx \epsilon_2/\sigma_2$ ($\epsilon_1$ is the dielectric constant of the oxide semiconductor and $\sigma_1$ is the electric conductivity of the oxide semiconductor).

As described above, a semiconductor device including an oxide semiconductor and having stable electric characteristics can be provided. Therefore, a semiconductor device with high reliability can be provided.

The structures, methods, and the like described in this embodiment can be combined as appropriate with any of the structures, methods, and the like described in the other embodiments.

(Embodiment 2)

In this embodiment, another embodiment of a method for manufacturing a semiconductor device will be described. The same portion as or a portion having a function similar to that in the above embodiment can be formed as in the above embodiment, and the same step as or a step similar to that in the above embodiment can be performed as in the above embodiment, and thus repetitive description is omitted. In addition, detailed description of the same portion is not repeated.

In this embodiment, an example of performing heat treatment on the oxide semiconductor film before forming the metal oxide film 407 in contact with the oxide semiconductor film, in the method for manufacturing the transistor 410 in Embodiment 1, will be described.

This heat treatment may be performed on the oxide semiconductor film before being processed into the island-shaped oxide semiconductor film, as long as the heat treatment is performed after the formation of the oxide semiconductor film and before the formation of the metal oxide film 407, and the heat treatment may be performed before the formation of the source electrode 405a and the drain electrode 405b or after the formation of the source electrode 405a and the drain electrode 405b.

The heat treatment is performed at a temperature of 250° C. to 650° C. inclusive, preferably 450° C. to 600° C. inclusive. For example, the substrate is introduced into an electric furnace which is one of heat treatment apparatuses, and the heat treatment is performed on the oxide semiconductor film at 450° C. for 1 hour in a nitrogen atmosphere. After the heat treatment, the metal oxide film is preferably formed without exposing the substrate to the air so that water or hydrogen can be prevented from entering the oxide semiconductor film.

Further, the heat treatment apparatus is not limited to an electric furnace, and a device for heating an object to be processed by heat conduction or heat radiation from a heating element such as a resistance heating element may be used. For example, an RTA apparatus such as a GRTA apparatus or an LRTA apparatus can be used. Note that in the case where a GRTA apparatus is used as the heat treatment apparatus, the substrate may be heated in an inert gas heated to high temperature of 650° C. to 700° C. because the heat treatment time is short.

The heat treatment may be performed in an atmosphere of nitrogen, oxygen, ultra-dry air (air in which the water content is 20 ppm or less, preferably 1 ppm or less, more preferably 10 ppb or less), or a rare gas (argon, helium, or the like). Note that it is preferable that water, hydrogen, or the like be not contained in the atmosphere of nitrogen, oxygen, ultra-dry air, or a rare gas. Alternatively, nitrogen, oxygen, or a rare gas which is introduced into the heat treatment apparatus has a purity of 6N (99.9999%) or more, preferably 7N (99.99999%) or more (that is, the impurity concentration is 1 ppm or less, preferably 0.1 ppm or less).

With this heat treatment, impurities such as moisture or hydrogen in the oxide semiconductor film can be reduced.

Moreover, the metal oxide film is formed over the oxide semiconductor film, and oxygen is introduced to the oxide semiconductor film through the metal oxide film that is an oxide insulating layer, so that a bond between a metal included in the oxide semiconductor and hydrogen or a bond between the metal and a hydroxyl group is cut, and the hydrogen or the hydroxyl group reacts with oxygen to produce water. After the introduction of oxygen, an insulating layer is formed and heat treatment is further performed, whereby impurities such as hydrogen or a hydroxyl group firmly left can be easily eliminated as water.

The oxide semiconductor film and the metal oxide film containing oxygen are in contact with each other when being subjected to the heat treatment; thus, oxygen which is one of the main components of the oxide semiconductor and is reduced in the step of removing impurities, can be supplied from the metal oxide film containing oxygen to the oxide semiconductor film.

Thus, when the oxide semiconductor film is subjected to the heat treatment before the metal oxide film is formed and the heat treatment after the metal oxide film is formed, and oxygen is introduced, an I-type (intrinsic) oxide semiconductor film or a substantially I-type oxide semiconductor film from which impurities such as moisture or hydrogen are further eliminated, can be obtained.

Therefore, the transistor including the highly purified oxide semiconductor film has controlled variation in electric characteristics and is electrically stable.

In the transistor including the metal oxide film having a function of preventing electrification, generation of a parasitic channel on the back channel side of the oxide semiconductor film can be prevented. Moreover, by preventing the generation of a parasitic channel on the back channel side of the oxide semiconductor film in the transistor, variation in the threshold voltage can be suppressed.

As described above, a semiconductor device including an oxide semiconductor, which has stable electric characteristics, can be provided. Therefore, a semiconductor device with high reliability can be provided.

The structures, methods, and the like described in this embodiment can be combined as appropriate with any of the structures, methods, and the like described in other embodiments.

(Embodiment 3)

A semiconductor device with a display function (also referred to as a display device) can be manufactured using the transistor whose example is described in Embodiment 1 or 2. Moreover, some or all of driver circuits which include transistors can be formed over a substrate where a pixel portion is formed, whereby a system-on-panel can be obtained.

Figure 2A:
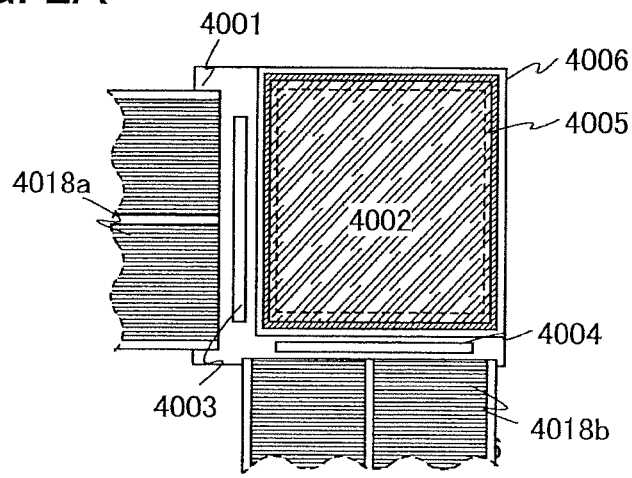
FIGS. 2A to 2C are diagrams each illustrating one embodiment of a semiconductor device.

In FIG. 2A, a sealant 4005 is provided so as to surround a pixel portion 4002 provided over a first substrate 4001, and the pixel portion 4002 is sealed by using a second substrate 4006. In FIG. 2A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potentials are supplied to the signal line driver circuit 4003 and the scan line driver circuit 4004 which are separately formed and the pixel portion 4002 from flexible printed circuits (FPCs) 4018a and 4018b.

Figure 2B:
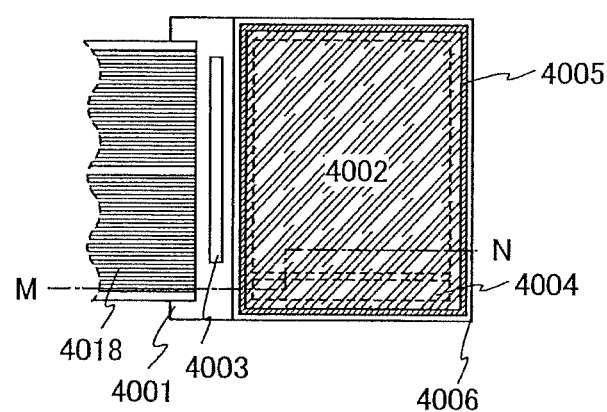
Figure 2C:
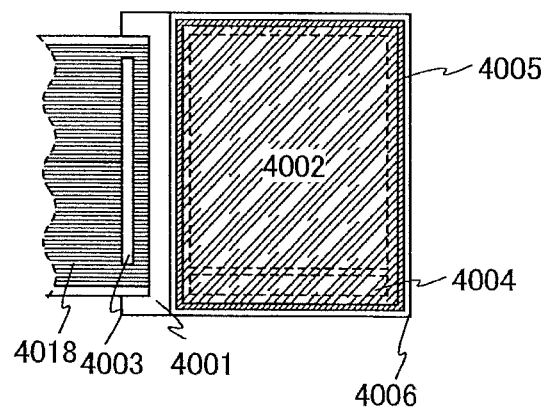

In FIGS. 2B and 2C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 2B and 2C, the signal line driver circuit 4003 which is fanned using a single crystal semiconductor film or a polycrystalline semiconductor film over a substrate separately prepared is mounted in a region that is different from the region surrounded by the sealant 4005 over the first substrate 4001. In FIGS. 2B and 2C, various signals and potential are supplied to the signal line driver circuit 4003 which is separately formed, the scan line driver circuit 4004, and the pixel portion 4002 from an FPC 4018.

Although FIGS. 2B and 2C each illustrate the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 2A illustrates the example in which the signal line driver circuit 4003 and the scan line driver circuit 4004 are mounted by a COG method. FIG. 2B illustrates the example in which the signal line driver circuit 4003 is mounted by a COG method. FIG. 2C illustrates the example in which the signal line driver circuit 4003 is mounted by a TAB method.

In addition, the display device includes a panel in which the display element is sealed, and a module in which an IC and the like including a controller are mounted on the panel.

Note that the display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate include a plurality of transistors, to which the transistor whose example is described in Embodiment 1 or 2 can be applied.

As a display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 3:
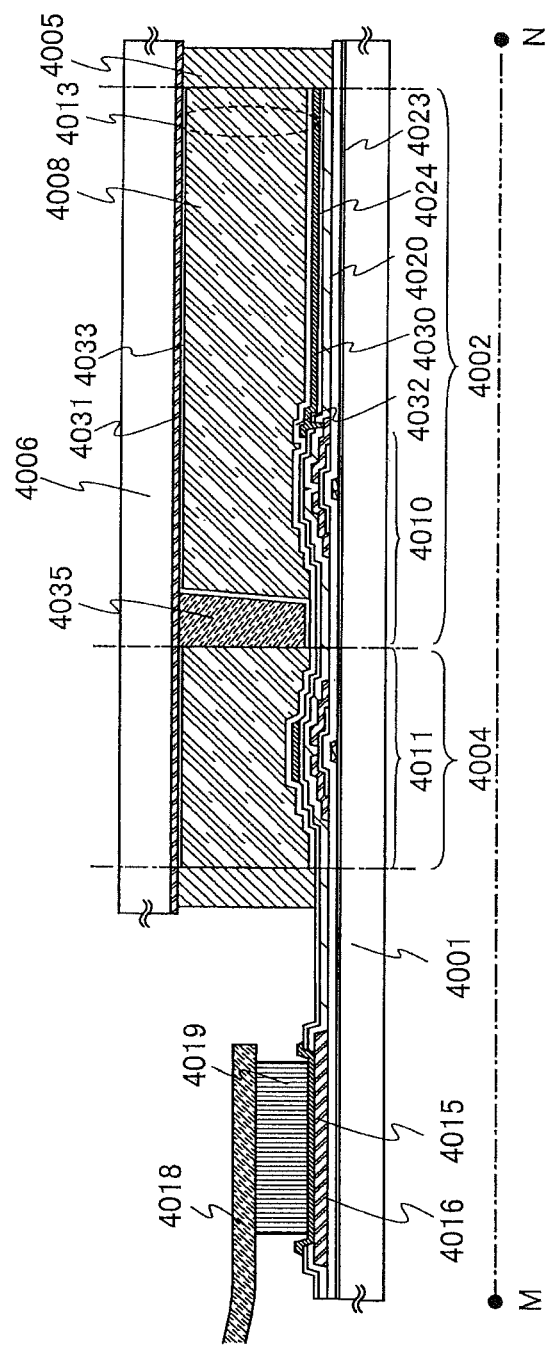
FIG. 3 is a diagram illustrating one embodiment of a semiconductor device.
Figure 4:
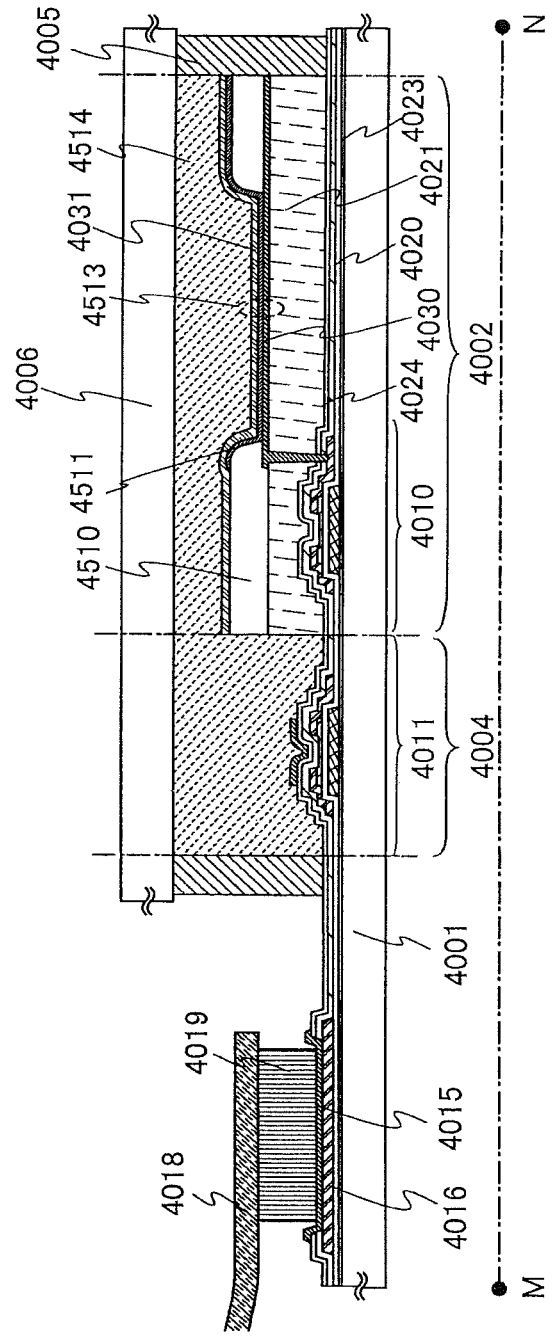
FIG. 4 is a diagram illustrating one embodiment of a semiconductor device.
Figure 5:
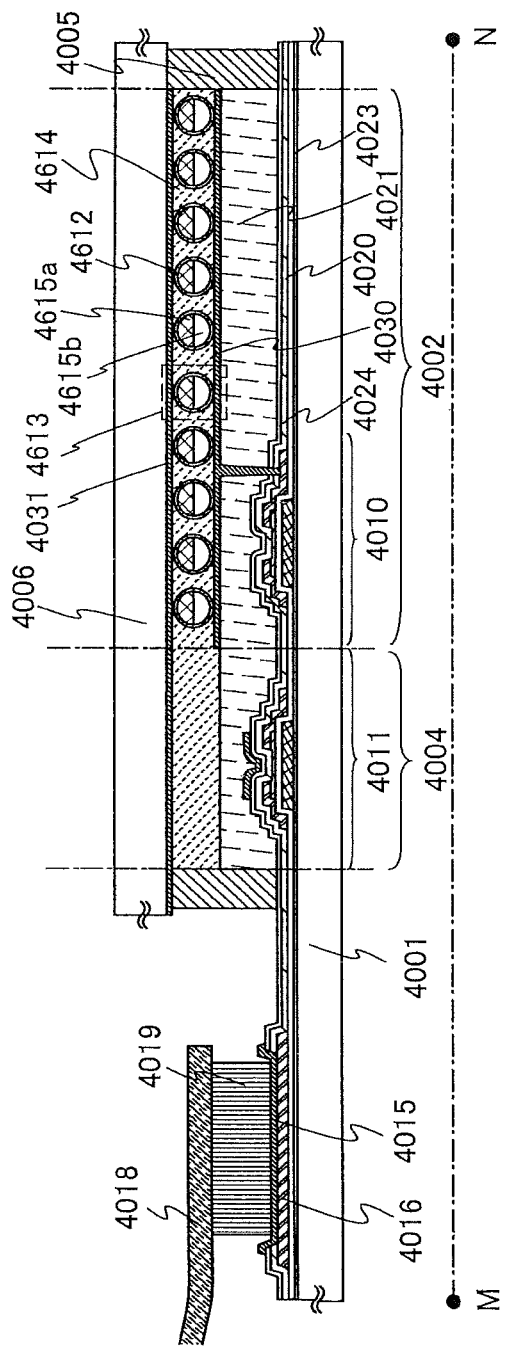
FIG. 5 is a diagram illustrating one embodiment of a semiconductor device.

Embodiments of the semiconductor device will be described with reference to FIG. 3, FIG. 4, and FIG. 5. FIG. 3, FIG. 4, and FIG. 5 correspond to cross-sectional views along line M-N in FIG. 2B.

As illustrated in FIG. 3, FIG. 4, and FIG. 5, the semiconductor device includes a connection terminal electrode 4015a and a terminal electrode 4016, and the connection terminal electrode 4015a and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrodes of transistors 4010 and 4011.

Each of the pixel portion 4002 and the scan line driver circuit 4004 which are provided over the first substrate 4001 includes a plurality of transistors. In FIG. 3, FIG. 4, and FIG. 5, the transistor 4010 included in the pixel portion 4002 and the transistor 4011 included in the scan line driver circuit 4004 are illustrated as an example. In FIG. 3, a metal oxide film 4020 having a function of preventing electrification and an insulating film 4024 are provided over the transistors 4010 and 4011. In FIG. 4 and FIG. 5, an insulating layer 4021 is further provided. Note that an insulating film 4023 is an insulating film serving as a base film.

In this embodiment, the transistor described in Embodiment 1 or 2 can be applied to the transistors 4010 and 4011.

In the transistors 4010 and 4011, the oxide semiconductor film is an oxide semiconductor film which is highly purified and from which impurities such as hydrogen, moisture, a hydroxyl group, or hydride (also referred to as a hydrogen compound) are intentionally removed. Such an oxide semiconductor film is obtained by performing heat treatment after introducing oxygen through the metal oxide film 4020 and forming the insulating film 4024 stacked over the metal oxide film 4020. By the introduction of oxygen, a bond between a metal included in the oxide semiconductor and hydrogen or a bond between the metal and a hydroxyl group is cut, and the hydrogen or the hydroxyl group reacts with oxygen to produce water; this leads to easy elimination of hydrogen or a hydroxyl group that is an impurity, in the form of water by heat treatment performed later.

Oxygen is introduced to the oxide semiconductor film through the metal oxide film 4020 stacked over the oxide semiconductor film, so that introduction depth (an introduction region) of oxygen can be controlled, and oxygen can be introduced to the oxide semiconductor film efficiently.

The oxide semiconductor film and the metal oxide film 4020 containing oxygen are in contact with each other when being subjected to the heat treatment; thus, oxygen which is one of the main components of the oxide semiconductor and is reduced in the step of removing impurities, can be supplied from the metal oxide film 4020 containing oxygen to the oxide semiconductor film. Thus, the oxide semiconductor film is more highly purified to become electrically I-type (intrinsic).

Consequently, variation in the electric characteristics of the transistors 4010 and 4011 each including the highly purified oxide semiconductor film is suppressed and the transistors 4010 and 4011 are electrically stable. As described above, semiconductor devices with high reliability can be provided as the semiconductor devices of this embodiment illustrated in FIG. 3, FIG. 4, and FIG. 5.

In addition, in the transistor including the metal oxide film having a function of preventing electrification, generation of a parasitic channel on the back channel side of the oxide semiconductor film can be prevented. Further, by preventing generation of a parasitic channel on the back channel side of the oxide semiconductor film in the transistor, variation in the threshold voltage can be suppressed.

In addition, in this embodiment, a conductive layer is provided over the insulating film 4024 so as to overlap with a channel formation region of the oxide semiconductor film in the transistor 4011 for the driver circuit. By providing the conductive layer so as to overlap with the channel formation region of the oxide semiconductor film, the amount of change in the threshold voltage of the transistor 4011 before and after the BT test can be further reduced. The potential of the conductive layer may be the same as or different from that of a gate electrode of the transistor 4011. The conductive layer can also function as a second gate electrode. The potential of the conductive layer may be GND, 0V, or in a floating state.

In addition, the conductive layer functions to block an external electric field, that is, to prevent an external electric field (particularly, to block static electricity) from effecting the inside (a circuit portion including a thin film transistor). A blocking function of the conductive layer can prevent the variation in the electric characteristics of the transistor due to the effect of external electric field such as static electricity.

The transistor 4010 included in the pixel portion 4002 is electrically connected to a display element to form a display panel. A variety of display elements can be used as the display element as long as display can be performed.

Note that an example of a liquid crystal display device using a liquid crystal element as a display element is illustrated in FIG. 3. In FIG. 3, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness of the liquid crystal layer 4008 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 wt % or more of a chiral material is mixed is used for the liquid crystal layer in order to improve the temperature range. The liquid crystal composition which includes liquid crystal exhibiting a blue phase and a chiral material has a short response time of 1 msec or less, has optical isotropy, which makes the alignment process unneeded, and has a small viewing angle dependence. In addition, since an alignment film does not need to be provided and thus rubbing treatment is unnecessary, electrostatic discharge damage caused by rubbing treatment can be prevented, and defects and damage of the liquid crystal display device can be reduced in the manufacturing process. Thus, the productivity of the liquid crystal display device can be increased. A transistor including an oxide semiconductor film has a possibility that the electric characteristics of the transistor may vary significantly by the influence of static electricity and deviate from the designed range. Therefore, it is more effective to use a liquid crystal material exhibiting a blue phase for the liquid crystal display device including the transistor that includes the oxide semiconductor film.

The specific resistivity of the liquid crystal material is $1 \times 10^9$ Ω·cm or more, preferably $1 \times 10^{11}$ Ω·cm or more, more preferably $1 \times 10^{12}$ Ω·cm or more. The value of the specific resistivity in this specification is measured at 20° C.

The size of a storage capacitor formed in the liquid crystal display device is set considering the leakage current of the transistor provided in the pixel portion or the like so that charges can be held for a predetermined period. By using the transistor including the high-purity oxide semiconductor film, it is enough to provide a storage capacitor having a capacitance that is ⅓ or less, preferably ⅕ or less of a liquid crystal capacitance of each pixel.

In the transistor used in this embodiment, which includes the highly purified oxide semiconductor film, the current in an off state (the off-state current) can be made small. Accordingly, an electric signal such as an image signal can be held for a longer period, and a writing interval can be set long in an on state. Accordingly, frequency of refresh operation can be reduced, which leads to an effect of suppressing power consumption.

In addition, the transistor including the highly purified oxide semiconductor film used in this embodiment can have relatively high field-effect mobility and thus can operate at high speed. Therefore, by using the transistor in a pixel portion of a liquid crystal display device, a high-quality image can be provided. In addition, a driver circuit portion and a pixel portion which include the above transistor can be formed over one substrate; thus, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an ASV mode, and the like can be given. Moreover, it is possible to use a method called domain multiplication or multi-domain design, in which a pixel is divided into some regions (subpixels) and molecules are aligned in different directions in different regions.

In addition, in the display device, a black matrix (a light-blocking layer), an optical member (an optical substrate) such as a polarizing member, a retardation member, or an antireflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method for the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between dots of respective color elements. This embodiment is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer in which particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side. A light-emitting element having any of these emission structures can be used.

FIG. 4 illustrates an example of a light-emitting device in which a light-emitting element is used as a display element. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 4. The structure of the light-emitting element 4513 can be changed as appropriate depending on a direction in which light is extracted from the light-emitting element 4513, or the like.

A partition wall 4510 is formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that the light-emitting device be packaged (sealed) with a protective film (such as a laminate film or an ultraviolet curable resin film) or a cover material with high air-tightness and little degasification so as not to be exposed to the outside air, in this manner.

As the filler 4514, an ultraviolet curable resin or a thermosetting resin can be used, in addition to an inert gas such as nitrogen or argon, and polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device includes a plurality of microcapsules dispersed in a solvent or a solute, each microcapsule including first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material thereof.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 5 illustrates an active matrix electronic paper as one embodiment of the semiconductor device. The electronic paper in FIG. 5 is an example of a display device using a twisting ball display system.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIG. 3, FIG. 4, and FIG. 5, as the first substrate 4001 and the second substrate 4006, flexible substrates, for example, plastic substrates having a light-transmitting property or the like can be used, in addition to glass substrates. As plastic, a fiberglass-reinforced plastic (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating film 4024 functions as a protective film of the transistors.

In addition, the metal oxide film 4020 has a function of supplying the oxide semiconductor film with oxygen which is reduced in the step of removing impurities such as hydrogen, moisture, a hydroxyl group, or hydride as well as a function of preventing generation of a parasitic channel on the back channel side of the oxide semiconductor film.

The metal oxide film 4020 may be formed using a gallium oxide film formed by a sputtering method. Alternatively, the metal oxide film 4020 may be a film obtained by adding indium or zinc to gallium oxide; for example, a gallium oxide film containing indium or zinc at 0.01 at. % to 5 at. % can be used. By addition of indium or zinc, the electric conductivity of the metal oxide film 4020 can be improved, whereby accumulation of charges can be further reduced.

The insulating film 4024 can be formed with a single-layer structure or a stacked-layer structure using one or more of a silicon nitride film, a silicon nitride oxide film, an aluminum oxide film, an aluminum nitride film, an aluminum oxynitride film, and an aluminum nitride oxide film by a sputtering method.

The insulating layer 4021 can be formed using an inorganic insulating material or an organic insulating material. Note that the insulating layer 4021 formed using a heat-resistant organic insulating material such as an acrylic resin, polyimide, a benzocyclobutene resin, polyamide, or an epoxy resin is preferably used as a planarizing insulating film. Other than such organic insulating materials, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method, screen printing, or offset printing), roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer 4030 and the second electrode layer 4031 (each of which is also called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

For the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide containing titanium oxide, indium tin oxide, ITO, indium zinc oxide, or indium tin oxide to which silicon oxide is added, can be used.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition containing a conductive high molecule (also referred to as a conductive polymer) can be used for the first electrode layer 4030 and the second electrode layer 4031. As the conductive high molecule, a so-called —-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferably provided. The protective circuit is preferably formed using a nonlinear element.

By using any of the transistors described in Embodiment 1 or 2 as described above, the semiconductor device can have a variety of functions.

(Embodiment 4)

A semiconductor device having an image sensor function for reading data of an object can be formed with the use of the transistor whose example is described in Embodiment 1 or 2.

Figure 6A:
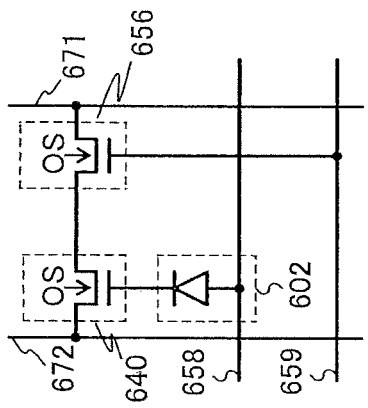
FIGS. 6A and 6B are diagrams illustrating one embodiment of a semiconductor device.

An example of the semiconductor device having an image sensor function is illustrated in FIG. 6A. FIG. 6A is an equivalent circuit of a photo sensor and FIG. 6B is a cross-sectional view illustrating part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photo sensor output signal line 671.

Note that in circuit diagrams in this specification, a transistor including an oxide semiconductor film is denoted by a symbol "OS" so that it can be identified as a transistor including an oxide semiconductor film. The transistor 640 and the transistor 656 in FIG. 6A are transistors each including an oxide semiconductor film.

Figure 6B:
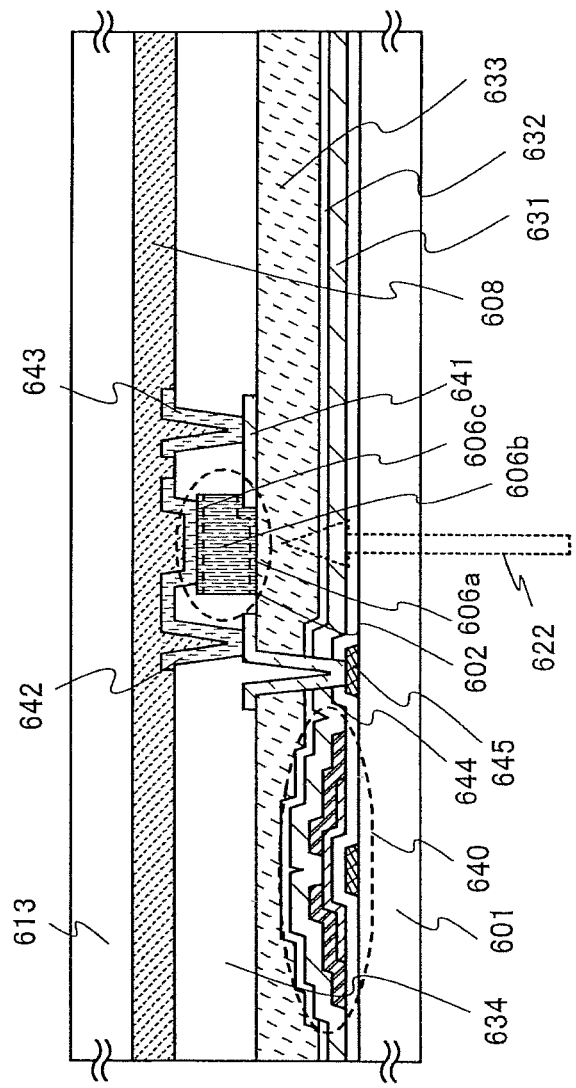

FIG. 6B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 using an adhesive layer 608.

A metal oxide film 631 having a function of preventing electrification, an insulating film 632, an interlayer insulating layer 633, and an interlayer insulating layer 634 are provided over the transistor 640. The photodiode 602 is provided over the interlayer insulating layer 633. In the photodiode 602, a first semiconductor layer 606a, a second semiconductor layer 606b, and a third semiconductor layer 606c are stacked in that order over the interlayer insulating layer 633 between an electrode layer 641 formed over the interlayer insulating layer 633 and an electrode layer 642 formed over the interlayer insulating layer 634.

In the transistor 640, the oxide semiconductor film is an oxide semiconductor film which is highly purified and from which impurities such as hydrogen, moisture, a hydroxyl group, or hydride (also referred to as a hydrogen compound) are intentionally removed. Such an oxide semiconductor film is obtained by performing heat treatment after introducing oxygen through the metal oxide film 631 stacked over the oxide semiconductor film and forming the insulating film 632 over the metal oxide film 631. By the introduction of oxygen, a bond between a metal included in the oxide semiconductor and hydrogen or a bond between the metal and a hydroxyl group is cut, and the hydrogen or the hydroxyl group reacts with oxygen to produce water; this leads to easy elimination of hydrogen or a hydroxyl group that is an impurity, in the form of water by heat treatment performed later.

Oxygen is introduced to the oxide semiconductor film through the metal oxide film 631 stacked over the oxide semiconductor film, so that introduction depth (an introduction region) of oxygen can be controlled, and oxygen can be introduced to the oxide semiconductor film efficiently.

The oxide semiconductor film and the metal oxide film 631 containing oxygen are in contact with each other when being subjected to the heat treatment; thus, oxygen which is one of the main components of the oxide semiconductor and is reduced in the step of removing impurities, can be supplied from the metal oxide film 631 containing oxygen to the oxide semiconductor film. Thus, the oxide semiconductor film is more highly purified to become electrically I-type (intrinsic).

Consequently, variation in the electric characteristics of the transistor 640 including the highly purified oxide semiconductor film is suppressed and the transistor 640 is electrically stable. As described above, a semiconductor device with high reliability can be provided as the semiconductor device in this embodiment.

The electrode layer 641 is electrically connected to a conductive layer 643 which is formed in the interlayer insulating layer 634, and the electrode layer 642 is electrically connected to a gate electrode 645 through an electrode layer 644. The gate electrode 645 is electrically connected to a gate electrode of the transistor 640, and the photodiode 602 is electrically connected to the transistor 640.

Here, a pin photodiode in which a semiconductor layer having p-type conductivity as the first semiconductor layer 606a, a high-resistance semiconductor layer (I-type semiconductor layer) as the second semiconductor layer 606b, and a semiconductor layer having n-type conductivity as the third semiconductor layer 606c are stacked is illustrated as an example.

The first semiconductor layer 606a is a p-type semiconductor layer and can be formed using an amorphous silicon film containing an impurity element imparting p-type conductivity. The first semiconductor layer 606a is formed by a plasma CVD method with the use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The first semiconductor layer 606a is preferably formed to have a thickness of 10 nm to 50 nm inclusive.

The second semiconductor layer 606b is an I-type semiconductor layer (intrinsic semiconductor layer) and is formed using an amorphous silicon film. As for formation of the second semiconductor layer 606b, an amorphous silicon film is formed with the use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be formed by an LPCVD method, a vapor deposition method, a sputtering method, or the like. The second semiconductor layer 606b is preferably formed to have a thickness of 200 nm to 1000 nm inclusive.

The third semiconductor layer 606c is an n-type semiconductor layer and is formed using an amorphous silicon film containing an impurity element imparting n-type conductivity. The third semiconductor layer 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The third semiconductor layer 606c is preferably formed to have a thickness of 20 nm to 200 nm inclusive.

The first semiconductor layer 606a, the second semiconductor layer 606b, and the third semiconductor layer 606c are not necessarily formed using an amorphous semiconductor, and they may be formed using a polycrystalline semiconductor or a microcrystalline semiconductor (a semiamorphous semiconductor: SAS).

Considering Gibbs free energy, a microcrystalline semiconductor is in a metastable state which is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. The semiconductor contains hydrogen or halogen of at least 1 at. % to terminate a dangling bond. Moreover, microcrystalline silicon contains a rare gas element such as helium, argon, krypton, or neon to further promote lattice distortion, so that stability can be increased and a favorable microcrystalline semiconductor film can be obtained.

The microcrystalline semiconductor film can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed using a gas containing silicon such as $SiH_4$, $Si_2H_6$, $SiH_2Cl_2$, $SiHCl_3$, $SiCl_4$, or $SiF_4$, which is diluted with hydrogen. Further, with the gas containing silicon diluted with one or plural kinds of rare gas elements selected from helium, argon, krypton, and neon in addition to hydrogen, the microcrystalline semiconductor film can be formed. In that case, the flow ratio of hydrogen to the gas containing silicon is 5:1 to 200:1 inclusive, preferably 50:1 to 150:1 inclusive, more preferably 100:1. Further, a carbide gas such as $CH_4$ or $C_2H_6$, a gas containing germanium such as $GeH_4$ or $GeF_4$, $F_2$, or the like may be mixed into the gas containing silicon.

In addition, since the mobility of holes generated by the photoelectric effect is lower than that of electrons, the pin photodiode has better characteristics when a surface on the p-type semiconductor layer side is used as a light-receiving surface. Here, an example in which light 622 received by the photodiode 602 from a surface of the substrate 601, over which the pin photodiode is formed, is converted into electric signals is described. Further, light from the semiconductor layer having a conductivity type opposite to that of the semiconductor layer on the light-receiving surface is disturbance light; therefore, the electrode layer on the semiconductor layer having a conductivity type opposite to that of the semiconductor layer on the light-receiving surface is preferably formed using a light-blocking conductive film. Note that a surface of the n-type semiconductor layer side can alternatively be used as the light-receiving surface.

The metal oxide film 631 may be foamed using a gallium oxide film formed by a sputtering method. In addition, the metal oxide film 631 may be a film obtained by adding indium or zinc to gallium oxide; for example, a gallium oxide film containing indium or zinc at 0.01 at. % to 5 at. % can be used. By addition of indium or zinc, the electric conductivity of the metal oxide film 631 can be improved, whereby accumulation of charges can be further reduced.

The insulating film 632 can be formed with a single-layer or stacked-layer structure using one or more of oxide insulating layers such as a silicon oxide layer, a silicon oxynitride layer, an aluminum oxide layer, and an aluminum oxynitride layer, and nitride insulating layers such as a silicon nitride layer, a silicon nitride oxide layer, an aluminum nitride layer, and an aluminum nitride oxide layer.

For reduction of the surface roughness, an insulating layer functioning as a planarizing insulating film is preferably used as the interlayer insulating layers 633 and 634. The interlayer insulating layers 633 and 634 can be formed using, for example, an organic insulating material such as polyimide, an acrylic resin, a benzocyclobutene resin, polyamide, or an epoxy resin. Other than such organic insulating materials, a single-layer or stacked-layer structure using a low-dielectric constant material (a low-k material), a siloxane based resin, phosphosilicate glass (PSG), borophosphosilicate glass (BPSG), or the like can be used.

The insulating film 632, the interlayer insulating layer 633, and the interlayer insulating layer 634 can be formed using an insulating material by a sputtering method, a spin coating method, a dipping method, spray coating, a droplet discharge method (e.g., an inkjet method, screen printing, or offset printing), roll coating, curtain coating, knife coating, or the like depending on the material.

When the light 622 that enters the photodiode 602 is detected, data on an object to be detected can be read. Note that a light source such as a backlight can be used at the time of reading data on an object to be detected.

The transistor whose example is described in Embodiment 1 or 2 can be used as the transistor 640. The transistor including the oxide semiconductor film which is highly purified by intentionally removing impurities such as hydrogen, moisture, a hydroxyl group, or hydride (also referred to as a hydrogen compound) has a suppressed variation in the electric characteristics and is electrically stable. In addition, in the transistor including the metal oxide film having a function of preventing electrification, generation of a parasitic channel on the back channel side of the oxide semiconductor film can be prevented. By preventing the generation of a parasitic channel on the back channel side of the oxide semiconductor film in the transistor, variation in the threshold voltage can be suppressed. Therefore, a semiconductor device with high reliability can be provided.

This embodiment can be implemented in appropriate combination with the structures described in other embodiments.

(Embodiment 5)

The liquid crystal display device disclosed in this specification can be applied to a variety of electronic devices (including game machines). Examples of the electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a personal digital assistant, an audio reproducing device, a large-sized game machine such as a pachinko machine, and the like. Examples of the electronic devices each including the liquid crystal display device described in the above embodiment will be described.

Figure 7A:
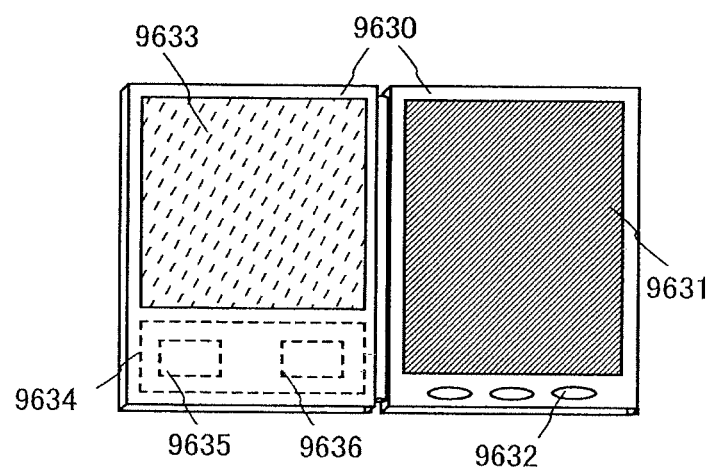
FIGS. 7A and 7B are diagrams illustrating an electronic device.

FIG. 7A illustrates an electronic book reader (also referred to as an e-book reader) which can include housings 9630, a display portion 9631, operation keys 9632, a solar cell 9633, and a charge and discharge control circuit 9634. The electronic book reader illustrated in FIG. 7A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Note that in FIG. 7A, the charge and discharge control circuit 9634 has a battery 9635 and a DCDC converter (hereinafter, abbreviated as a converter) 9636 as an example. The semiconductor device described in any of Embodiments 1 to 4 can be applied to the display portion 9631, whereby a highly reliable electronic book reader can be provided.

In the case of using a transflective or reflective liquid crystal display device as the display portion 9631 in the structure illustrated in FIG. 7A, the electronic book reader may be used in a comparatively bright environment. In that case, power generation by the solar cell 9633 and charge by the battery 9635 can be effectively performed, which is preferable. Since the solar cell 9633 can be provided on a space (a surface or a rear surface) of the housing 9630 as appropriate, the battery 9635 can be efficiently charged, which is preferable. When a lithium ion battery is used as the battery 9635, there is an advantage of downsizing or the like.

Figure 7B:
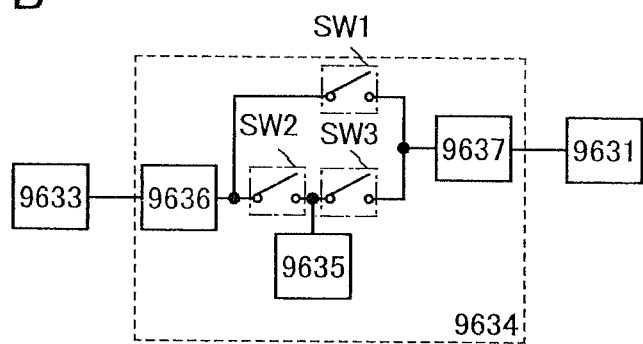

The structure and the operation of the charge and discharge control circuit 9634 illustrated in FIG. 7A are described with reference to a block diagram in FIG. 7B. The solar cell 9633, the battery 9635, the converter 9636, a converter 9637, switches SW1 to SW3, and the display portion 9631 are illustrated in FIG. 7B, and the battery 9635, the converter 9636, the converter 9637, and the switches SW1 to SW3 correspond to the charge and discharge control circuit 9634.

First, an example of the operation in the case where power is generated by the solar cell 9633 using external light is described. The voltage of power generated by the solar cell 9633 is raised or lowered by the converter 9636 so as to be voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and the switch SW2 is turned on so that charge of the battery 9635 may be performed.

Next, the operation in the case where power is not generated by the solar cell 9633 using external light is described. The voltage of power stored in the battery 9635 is raised or lowered by the converter 9637 by turning on the switch SW3. Then, power from the battery 9635 is used for the operation of the display portion 9631.

Note that although the solar cell 9633 is described as an example of a means for charge, charge of the battery 9635 may be performed with another means. In addition, a combination of the solar cell 9633 and another means for charge may be used.

Figure 8A:
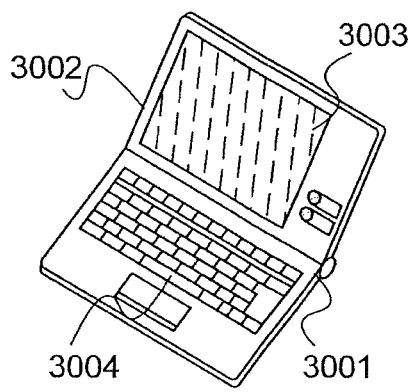
FIGS. 8A to 8F are diagrams each illustrating an electronic device.

FIG. 8A illustrates a laptop personal computer, which includes a main body 3001, a housing 3002, a display portion 3003, a keyboard 3004, and the like. The semiconductor device described in any of Embodiments 1 to 4 is applied to the display portion 3003, whereby a highly reliable laptop personal computer can be provided.

Figure 8B:
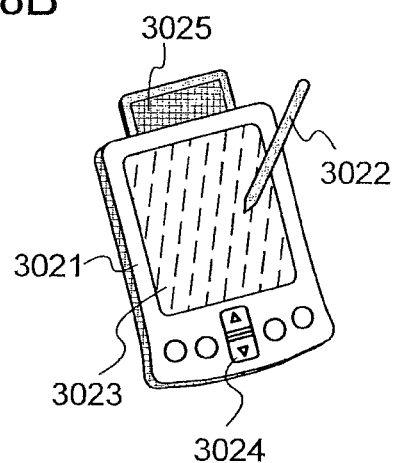

FIG. 8B is a personal digital assistant (PDA) including a display portion 3023, an external interface 3025, an operation button 3024, and the like in a main body 3021. In addition, a stylus 3022 is included as an accessory for operation. The semiconductor device described in any of Embodiments 1 to 4 is applied to the display portion 3023, whereby a highly reliable personal digital assistant (PDA) can be provided.

Figure 8C:
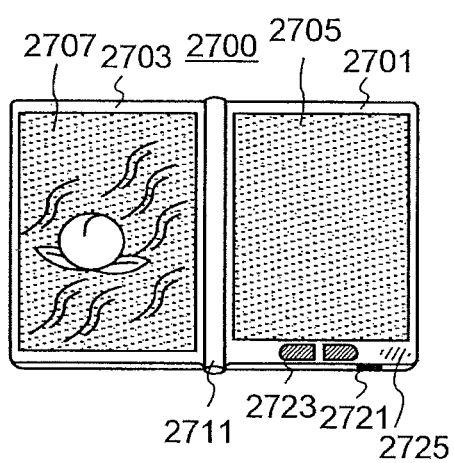

FIG. 8C illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed in the above display portions, for example, the right display portion (the display portion 2705 in FIG. 8C) can display text and the left display portion (the display portion 2707 in FIG. 8C) can display images. The semiconductor device described in any of Embodiments 1 to 4 is applied to the display portion 2705 and the display portion 2707, whereby a highly reliable electronic book reader can be provided.

FIG. 8C illustrates the example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 8D:
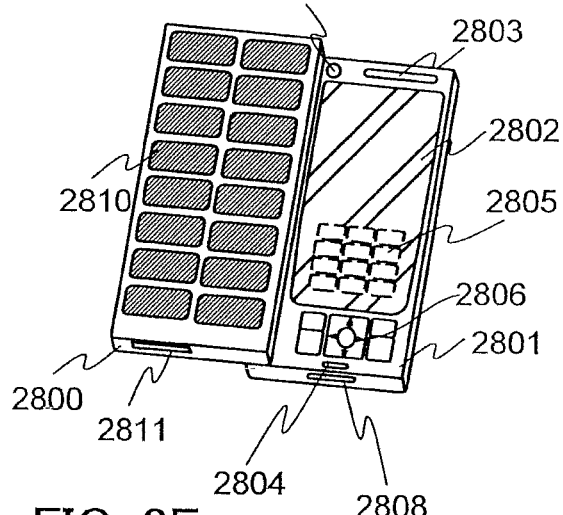

FIG. 8D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 for charging the mobile phone, an external memory slot 2811, and the like. Further, an antenna is incorporated in the housing 2801. The semiconductor device described in any of Embodiments 1 to 4 is applied to the display panel 2802, whereby a highly reliable mobile phone can be provided.

The display panel 2802 is provided with a touch panel. A plurality of operation keys 2805 which are displayed as images are illustrated by dashed lines in FIG. 8D. Note that a booster circuit by which a voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housing 2800 and the housing 2801 developed as illustrated in FIG. 8D can be slid so that one is lapped over the other; thus, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided.

Figure 8E:
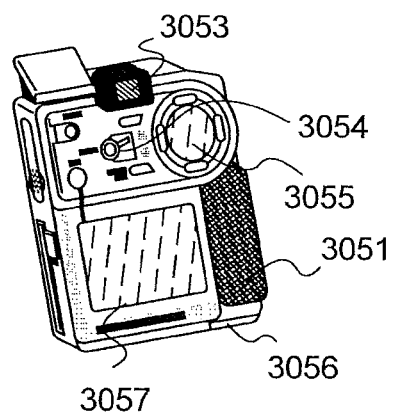

FIG. 8E illustrates a digital video camera which includes a main body 3051, a display portion A 3057, an eyepiece 3053, an operation switch 3054, a display portion B 3055, a battery 3056, and the like. The semiconductor device described in any of Embodiments 1 to 4 is applied to the display portion A 3057 and the display portion B 3055, whereby a highly reliable digital video camera can be provided.

Figure 8F:
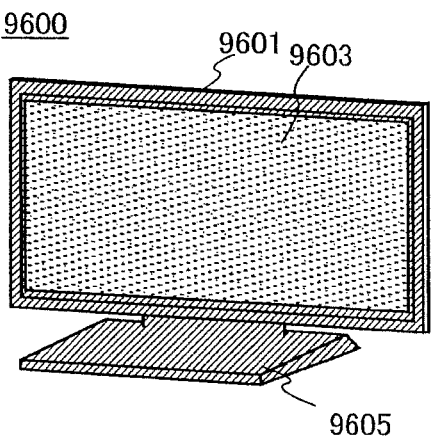

FIG. 8F illustrates an example of a television set. In a television set 9600, a display portion 9603 is incorporated in a housing 9601. The display portion 9603 can display images. Here, the housing 9601 is supported by a stand 9605. The semiconductor device described in any of Embodiments 1 to 4 is applied to the display portion 9603, whereby a highly reliable television set can be provided.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) data communication can be performed.

This embodiment can be implemented in appropriate combination with the structures described in the other embodiments.

This application is based on Japanese Patent Application serial no. 2010-072532 filed with Japan Patent Office on Mar. 26, 2010, the entire contents of which are hereby incorporated by reference.

The invention claimed is:

1. A method for manufacturing a semiconductor device, comprising the steps of:
    forming a gate electrode over a substrate;
    forming a gate insulating film over the gate electrode;
    forming an oxide semiconductor film overlapping with the gate electrode with the gate insulating film interposed therebetween;
    forming a source electrode and a drain electrode over the oxide semiconductor film;
    forming a metal oxide film comprising gallium over the source electrode and the drain electrode, the metal oxide film being in contact with the oxide semiconductor film;
    introducing oxygen to at least one of the oxide semiconductor film, the metal oxide film, and an interface between the oxide semiconductor film and the metal oxide film; and
    performing heat treatment.

2. A semiconductor device comprising:
    a gate electrode over a substrate;
    a gate insulating film over the gate electrode;
    an oxide semiconductor film overlapping with the gate electrode with the gate insulating film interposed therebetween;
    a source electrode and a drain electrode over the oxide semiconductor film; and
    a metal oxide film comprising gallium over the source electrode and the drain electrode, the metal oxide film being in contact with the oxide semiconductor film;
    wherein oxygen is introduced to at least one of the oxide semiconductor film, the metal oxide film, and an interface between the oxide semiconductor film and the metal oxide film.

3. The semiconductor device according to claim 2, wherein the metal oxide film comprises gallium oxide.

4. The semiconductor device according to claim 2, wherein the metal oxide film further comprises indium and zinc.

5. The semiconductor device according to claim 2, further comprises an insulating film over the metal oxide film.

6. The semiconductor device according to claim 2, wherein the metal oxide film is a gallium oxide film containing 0.01 at.% to 5 at.% of indium or zinc.

7. The semiconductor device, according to claim 2, wherein the oxide semiconductor film comprises indium, gallium and zinc.

8. The semiconductor device, according to claim 2, wherein a carrier concentration of the oxide semiconductor film is less than $1 \times 10^{14}$ cm$^{-3}$.

9. The semiconductor device, according to claim 2, wherein an electron affinity of the oxide semiconductor film plus 0.1 eV is greater than an electron affinity of the metal oxide film.

10. A semiconductor device comprising:
a gate electrode over a substrate;
a gate insulating film over the gate electrode;
an oxide semiconductor film overlapping with the gate electrode with the gate insulating film interposed therebetween;
a source electrode and a drain electrode over the oxide semiconductor film; and
a metal oxide film comprising gallium over the source electrode and the drain electrode, the metal oxide film being in contact with the oxide semiconductor film;
wherein a concentration of oxygen in a first region of at least one of the oxide semiconductor film, the metal oxide film and an interface between the oxide semiconductor film and the metal oxide film is higher than that in a second region of the oxide semiconductor film and the metal oxide film which does not include the first region.

11. The semiconductor device according to claim 10, wherein the metal oxide film comprises gallium oxide.

12. The semiconductor device according to claim 10, wherein the metal oxide film further comprises indium and zinc.

13. The semiconductor device according to claim 10, further comprises an insulating film over the metal oxide film.

14. The semiconductor device according to claim 10, wherein the metal oxide film is a gallium oxide film containing 0.01 at.% to 5 at.% of indium or zinc.

15. The semiconductor device, according to claim 10, wherein the oxide semiconductor film comprises indium, gallium and zinc.

16. The semiconductor device, according to claim 10, wherein a carrier concentration of the oxide semiconductor film is less than $1 \times 10^{14}$ cm$^{-3}$.

17. The semiconductor device, according to claim 10, wherein an electron affinity of the oxide semiconductor film plus 0.1 eV is greater than an electron affinity of the metal oxide film.

* * * * *